(12) United States Patent
Nariyuki et al.

(10) Patent No.: US 7,803,468 B2
(45) Date of Patent: Sep. 28, 2010

(54) ORGANIC ELECTROLUMINESCENT ELEMENT

(75) Inventors: Fumito Nariyuki, Kanagawa (JP); Kazuki Yamazaki, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 916 days.

(21) Appl. No.: 11/236,839

(22) Filed: Sep. 28, 2005

(65) Prior Publication Data

US 2006/0068223 A1    Mar. 30, 2006

(30) Foreign Application Priority Data

Sep. 29, 2004    (JP)    ............... 2004-284535

(51) Int. Cl.
*H01L 51/54*    (2006.01)
(52) U.S. Cl. .............. 428/690; 428/917; 313/504; 313/506; 252/301.16; 257/40; 257/E51.044
(58) Field of Classification Search ........... 428/619, 428/917; 313/504, 506; 257/40, E51.044
See application file for complete search history.

(56) References Cited

U.S. PATENT DOCUMENTS

| 2002/0028329 | A1* | 3/2002 | Ise et al. ............ 428/336 |
| 2002/0074935 | A1* | 6/2002 | Kwong et al. ......... 313/504 |
| 2002/0096995 | A1* | 7/2002 | Mishima et al. ....... 313/506 |
| 2003/0076032 | A1* | 4/2003 | Suzuri et al. ......... 313/504 |
| 2003/0205696 | A1* | 11/2003 | Thoms et al. ........ 252/301.16 |
| 2004/0164673 | A1 | 8/2004 | Suzuki et al. |
| 2005/0123797 | A1* | 6/2005 | Kondakova et al. ...... 428/690 |
| 2006/0192473 | A1 | 8/2006 | Kojima et al. |

FOREIGN PATENT DOCUMENTS

| JP | 2000-268958 A | 9/2000 |
| JP | 2001-189193 A | 7/2001 |
| JP | 2002-313583 A | 10/2002 |
| JP | 2002-324673 A | 11/2002 |
| JP | 2004-186027 A | 7/2004 |
| JP | 2004-265623 A | 9/2004 |
| JP | 2004-281379 A | 10/2004 |

OTHER PUBLICATIONS

Ren et al. "Ultrahigh energy gap hosts in deep blue organic electrophosphorescent devices." Chemistry of Materials. 2004. vol. 16, pp. 4743-4747.*
Japanese Office Action issued Jun. 29, 2010 in Application No. 2005-267380.

* cited by examiner

*Primary Examiner*—D. Lawrence Tarazano
*Assistant Examiner*—Michael Wilson
(74) *Attorney, Agent, or Firm*—Birch, Stewart, Kolasch & Birch, LLP

(57) ABSTRACT

An organic electroluminescent element including a pair of electrodes and one or more organic compound layers including at least one light-emitting layer disposed between the pair of electrodes, wherein the at least one light-emitting layer contains at least one luminescent dopant and a plurality of host compounds. The ionization potential of the dopant is Ip(D), the minimum value out of the ionization potentials of the plurality of host compounds is Ip(H)min, and ΔIp is defined by ΔIp=Ip(D)−Ip(H)min and satisfies a relationship of ΔIp>0 eV. The electron affinity of the dopant is Ea(D), the maximum value out of the electron affinities of the plurality of host compounds is Ea(H)max, and ΔEa is defined by ΔEa=EA(H)max−Ea(D) and satisfies a relationship of ΔEa>0 eV.

19 Claims, 2 Drawing Sheets

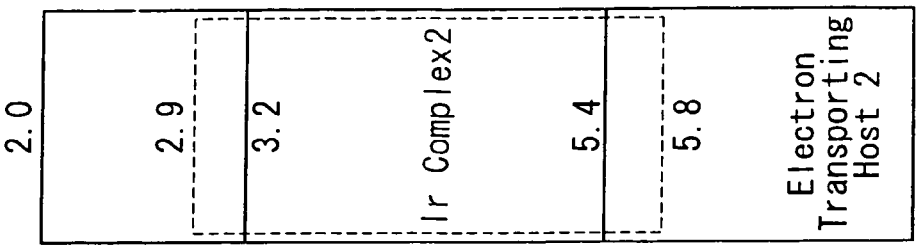
FIG.1E Example 5
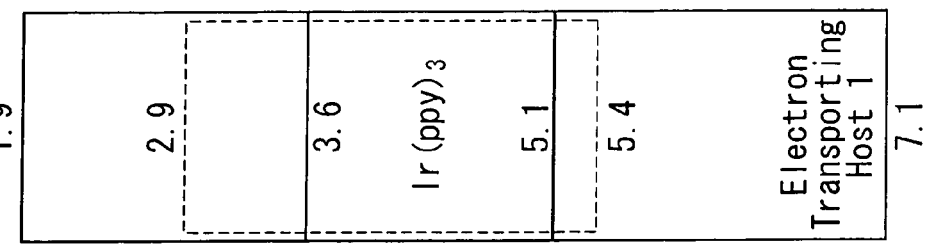
FIG.1D Example 4
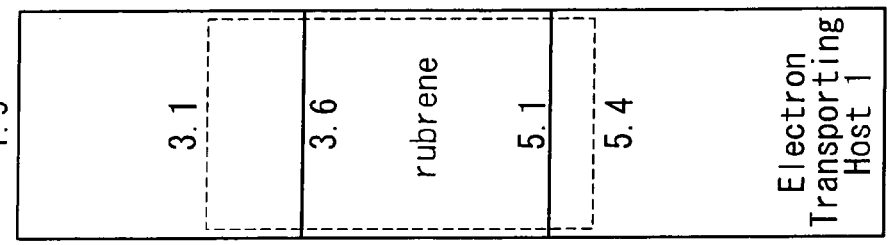
FIG.1C Example 3
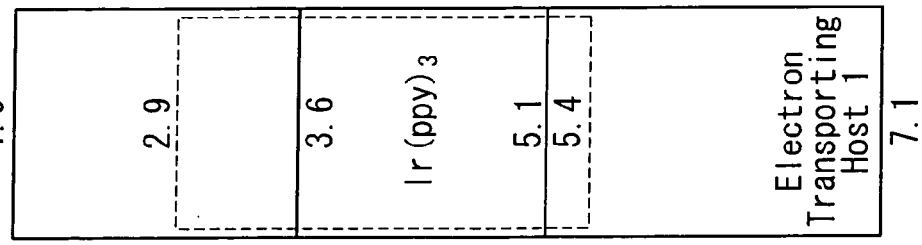
FIG.1B Example 2
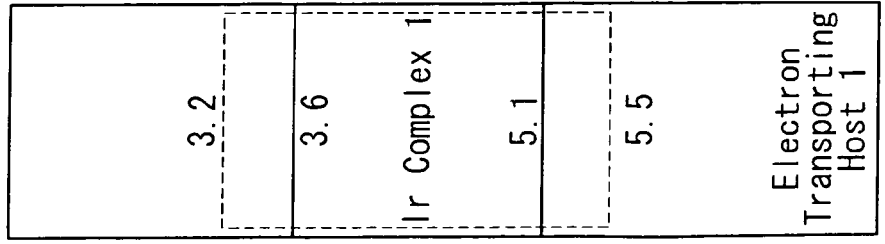
FIG.1A Example 1

ORGANIC ELECTROLUMINESCENT ELEMENT

CROSS-REFERENCE TO RELATED APPLICATION

This application claims priority under 35 USC 119 from Japanese Patent Application Nos. 2004-284535, the disclosure of which is incorporated by reference herein.

BACKGROUND OF THE INVENTION

1. Field of the Invention

The present invention relates to an organic electroluminescent element (hereinafter sometimes referred to as an "organic EL element", a "light-emitting element" or an "EL element") capable of emitting light by converting electric energy into light.

2. Description of the Related Art

Today, research and development for various display devices is being aggressively conducted and, in particular, organic electroluminescent (EL) elements are attracting attention as promising display devices because high brightness light can be emitted with a low voltage. A technique of using a plurality of compounds for the host material of the light-emitting layer and using each compound as an electron transporting host or a hole transporting host, thereby realizing reduction of power consumption and enhancement of driving durability, has been disclosed (see, for example, Japanese Patent Application Laid-Open (JP-A) Nos. 2002-313583 and 2002-324673, the disclosures of which are incorporated by reference herein). In these techniques, carriers injected into the light-emitting layer are trapped by a luminescent dopant and recombined to emit light and a high emission efficiency is obtained.

However, in such a method, since carriers are trapped by a luminescent dopant, the luminescent dopant inevitably deteriorates due to the carrier and therefore, sufficiently high driving durability cannot be easily obtained.

SUMMARY OF THE INVENTION

The present invention provides an organic electroluminescent element excellent in driving durability and luminescent property.

As a result of their research, the present inventors have found that when the energy levels, such as electron affinity and ionization potential, of the host material and luminescent dopant in the light-emitting layer are set to specific ranges, a mechanism of causing the luminescent dopant to emit light by utilizing the energy transfer from the host without causing trapping of carriers by the luminescent dopant can be obtained.

Based on this finding, an organic electroluminescent element particularly capable of preventing dopant deterioration due to carriers and ensuring excellent driving durability can be obtained.

A first aspect of the present invention is to provide an organic electroluminescent element including a pair of electrodes and one or more organic compound layers including at least one light-emitting layer disposed between the pair of electrodes, wherein the at least one light-emitting layer contains at least one luminescent dopant and a plurality of host compounds. The ionization potential of the dopant is Ip(D), the minimum value out of the ionization potentials of the plurality of host compounds is Ip(H)min, and $\Delta$Ip is defined by $\Delta$Ip=Ip(D)−Ip(H)min and satisfies a relationship of $\Delta$Ip>0 eV. The electron affinity of the dopant is Ea(D), the maximum value out of the electron affinities of the plurality of host compounds is Ea(H)max, and $\Delta$Ea is defined by $\Delta$Ea=EA(H)max−Ea(D) and satisfies a relationship of $\Delta$Ea>0 eV.

A second aspect of the invention is to provide an organic electroluminescent element including a pair of electrodes and one or more organic compound layers including at least one light-emitting layer disposed between the pair of electrodes, wherein the at least one light-emitting layer contains at least one luminescent dopant and a plurality of host compounds. The ionization potential of the dopant is Ip(D), the minimum value out of the ionization potentials of the plurality of host compounds is Ip(H)min, and $\Delta$Ip is defined by $\Delta$Ip=Ip(D)−Ip(H)min and satisfies a relationship of $\Delta$Ip>0 eV. The electron affinity of the dopant is Ea(D), the maximum value out of the electron affinities of the plurality of host compounds is Ea(H)max, and $\Delta$Ea is defined by $\Delta$Ea=EA(H)max−Ea(D) and satisfies a relationship of $\Delta$Ea>0 eV. The plurality of host compounds include a hole transporting host and an electron transporting host.

A third aspect of the invention is to provide an organic electroluminescent element including a pair of electrodes and one or more organic compound layers including at least one light-emitting layer disposed between the pair of electrodes, wherein the at least one light-emitting layer contains at least one luminescent dopant and a plurality of host compounds. The ionization potential of the dopant is Ip(D), the minimum value out of the ionization potentials of the plurality of host compounds is Ip(H)min, and $\Delta$Ip is defined by $\Delta$Ip=Ip(D)−Ip(H)min and satisfies a relationship of $\Delta$Ip>0 eV. The electron affinity of the dopant is Ea(D), the maximum value out of the electron affinities of the plurality of host compounds is Ea(H)max, and $\Delta$Ea is defined by $\Delta$Ea=EA(H)max−Ea(D) and satisfies a relationship of $\Delta$Ea>0 eV. The plurality of host compounds include a hole transporting host and an electron transporting host. The hole transporting host is selected from H-1, H-3, H-4, H-7 or H-8, the electron transporting host is selected from E-1 or E-11, and the luminescent dopant is selected from D-1 or D-3.

BRIEF DESCRIPTION OF THE DRAWINGS

FIGS. 1A to 1H are energy diagrams of Examples 1 to 5 and Comparative Examples 1 to 3, respectively.

DETAILED DESCRIPTION OF THE INVENTION

[Organic Electroluminescent Element]

Figure 1H:
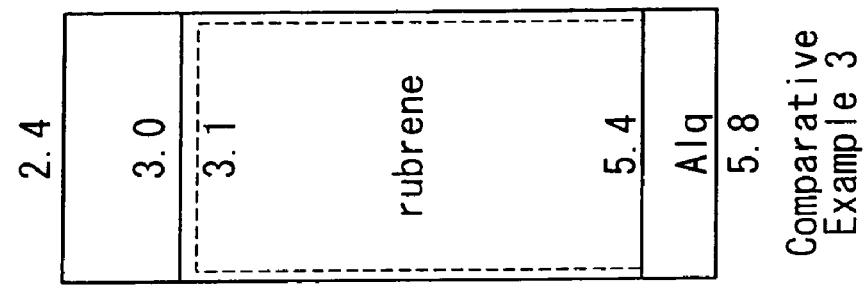

The organic electroluminescent element of the present invention is an organic electroluminescent element comprising a pair of electrodes and one or more organic compound layers including at least one light-emitting layer, wherein the light-emitting layer contains at least one luminescent dopant and a plurality of host compounds. The ionization potential of the dopant is Ip(D), the minimum value out of the ionization potentials of the plurality of host compounds is Ip(H)min, and $\Delta$Ip is defined by $\Delta$Ip=Ip(D)−Ip(H)min and satisfies a relationship of $\Delta$Ip>0 eV. The electron affinity of the dopant is Ea(D), the maximum value out of the electron affinities of the plurality of host compounds is Ea(H)max, and $\Delta$Ea is defined by $\Delta$Ea=EA(H)max−Ea(D) and satisfies a relationship of $\Delta$Ea>0 eV.

By virtue of this constitution, the organic electroluminescent element of the present invention can ensure excellent luminescent property and excellent driving durability.

In the organic electroluminescent element of the present invention, in view of driving durability, it is preferable that at least one of the relationships 1.2 eV>ΔIp>0.2 eV and 1.2 eV>ΔEa>0.2 eV is satisfied. It is more preferable that at least one of the relationships of 1.2 eV>ΔIp>0.4 eV and 1.2 eV>ΔEa>0.4 eV is satisfied. When at least one of the relationships 1.2 eV>ΔIp>0.2 eV and 1.2 eV>ΔEa>0.2 eV is satisfied, holes and/or electrons tend to be less likely to be trapped by the dopant, which is preferable from the viewpoint of driving durability.

In the organic electroluminescent element of the present invention, in view of color purity and driving durability, it is preferable that Ip(H)min is 5.1 eV or more and/or Ea(H)max is 3.0 eV or less. It is more preferable that Ip(H)min is 5.4 eV or more and/or Ea(H)max is 2.8 eV or less.

When Ip(H)min and/or Ea(H)max are within these ranges, interaction among the plurality of host compounds in the light-emitting layer can be controlled. If a charge transfer complex, an exciplex or the like having a lower excitation energy state is formed resulting from interaction among the plurality of host compounds, an excitation state which is normally formed on any host compound is formed on the charge transfer complex or exciplex and this may give rise to insufficient energy transfer to the dopant and failure in obtaining predetermined light emission. In addition, the driving durability may decrease due to decomposition of the charge transfer complex or exciplex from the excitation state.

Whether an interaction is present or not among the plurality of host compounds in the light-emitting layer can be judged by a method of forming a single layer film of only the plurality of host compounds contained in the light-emitting layer under the same conditions as in the formation of the light-emitting layer, measuring the fluorescent-phosphorescent spectrum, and comparing it with the respective light emission spectra of the individual host compounds each as measured alone.

That is, when a long-wavelength light emission spectrum component which is unassignable to the light-emission spectrum of each compound contained in the plurality of host compounds is observed in the fluorescent-phosphorescent spectrum, this implies the occurrence of interaction. In the fluorescent-phosphorescent spectrum of a single layer film formed from only the plurality of host compounds, the spectrum is preferably assigned to the respective light emission spectra of the plurality of host compounds each as measured alone. In particular, it is preferred that no light emission spectrum component is observed on the side 15 nm longer than respective main peaks in the light emission spectra of the plurality of host compounds each as measured alone.

In the measurement of the fluorescent-phosphorescent spectrum, for example, RF-5300PC manufactured by Shimadzu Corporation can be used. As for the excitation light, light at a wavelength where each host compound has absorption by itself is used.

The ionization potential (Ip), electron affinity (Ea) and triplet level ($T_1$) (which is described later) as used in the present invention are described below.

The ionization potential (Ip), electron affinity (Ea) and triplet level ($T_1$), which is described later, are values determined by measuring a single layer film formed on quartz by vacuum-depositing each material.

The ionization potential (Ip) is defined in terms of a value measured at room temperature in air by using an ultraviolet photoelectric analyzer AC-1 (manufactured by Riken Keiki Co., Ltd.). The measurement principle of AC-1 is described in Chihaya Adachi et al., *Yuki Hakumaku Sigoto Kansu Data Shu* (*Work Function Data of Organic Thin Film*), CMC (2004), the disclosure of which is incorporated by reference herein.

The electron affinity (Ea) is defined as a value obtained by calculating the band gap from the long wavelength end of the absorption spectrum of the single layer film and calculating the electron affinity (Ea) from the values of the calculated band gap and the above ionization potential.

The minimum triplet excitation energy (triplet level $T_1$) is defined as a value calculated from the short wavelength end of the phosphorescence emission spectrum measured at room temperature. As for the temperature, the measurement can also be performed at a nitrogen cooled temperature.

The light-emitting element of the present invention is excellent in terms of its driving durability and light emission property (external light emission efficiency), which excellence is presumed to be due to the following light emission mechanism, although the invention is not limited to such mechanism.

That is, holes injected from the anode pass through a hole injecting layer and a hole transporting layer and are mostly injected into a hole transporting host in the light-emitting layer. On the other hand, electrons injected from the cathode pass through an electron injecting layer and an electron transporting layer and are mostly injected into an electron transporting host in the light-emitting layer. The hole is injected from the hole transporting host into the highest occupied molecular orbital (HOMO) of the electron transporting host, and an exciton is produced on the electron transporting host. Alternatively, the electron is injected from the electron transporting host into the lowest unoccupied molecular orbital (LUMO) of the hole transporting host, and an exciton is produced on the hole transporting host. This excited state energy of the host moves to the dopant, and light is emitted from the singlet and(or) triplet state of the dopant.

At the injection of holes and electrons into the light-emitting layer, the hole is injected into the hole transporting host and the electron is injected into the electron transporting host, whereby the hole transporting host and the electron transporting host can be released from the anion state and the cation state, respectively, and, as a result, the driving durability is enhanced. Also, at the injection of holes and electrons into the light-emitting layer, the HOMO and the LUMO of the dopant are present at the outer side thereof and, therefore, carriers are scarcely injected into the dopant, so that a dopant having low resistance to the cation or anion state can have enhanced durability.

The constitution of the organic electroluminescent element of the present invention is described below.

The organic electroluminescent element of the present invention preferably includes a pair of electrodes having one or more organic compound layers including at least one light-emitting layer disposed between the pair of electrodes. The organic compound layers preferably further include a carrier transporting layer adjacent to the light-emitting layer. The carrier transporting layer is more preferably an electron transporting layer and/or a hole transporting layer. It is understood that the electrode configuration is not critical; any combination of electrode(s) which can supply electricity to the organic electroluminescent element may be used.

In view of the nature of the light-emitting element, at least one electrode of the paired electrodes is preferably transparent.

As for the layer constitution of the organic compound layer in the present invention, in a preferred embodiment, a hole transporting layer, a light-emitting layer and an electron transporting layer are disposed in this order from the anode side. Furthermore, an electron blocking layer and the like may be provided between the hole transporting layer and the light-emitting layer, and a hole blocking layer and the like may be provided between the light-emitting layer and the electron transporting layer. Also, a hole injecting layer may be provided between the anode and the hole transporting layer, and an electron injecting layer may be provided between the cathode and the electron transporting layer. Other layers may optionally be provided depending upon the end use of the light-emitting element.

In the organic electroluminescent element of the present invention, the organic compound layers preferably include at least a hole injecting layer, a hole transporting layer, a light-emitting layer, a hole blocking layer, an electron transporting layer and an electron injecting layer in this order from the anode side.

In the case where a hole blocking layer is provided between the light-emitting layer and the electron transporting layer, it is preferable that the organic compound layer adjacent to the light-emitting layer on the anode side is a hole transporting layer, and the organic compound layer adjacent to the light emitting layer on the cathode side is a hole blocking layer.

Each layer may be divided into a plurality of secondary layers.

The constituents of the light-emitting element of the present invention are described in detail below.

<Organic Compound Layer>

The organic compound layer of the present invention is described below.

The organic electroluminescent element of the present invention includes one or more organic compound layers including at least one light-emitting layer. Examples of organic compound layers other than the light-emitting layer include, as described above, layers such as a carrier transporting layer (hole transporting layer or electron transporting layer) adjacent to the light-emitting layer, a hole blocking layer, a hole injecting layer and an electron injecting layer.

From the viewpoint of decreasing the driving voltage, the organic compound layer preferably has a thickness of 50 nm or less, more preferably from 5 to 50 nm, and still more preferably from 10 to 40 nm.

The layer adjacent to the light-emitting layer on the anode side may be a hole injecting layer and the layer adjacent to the light-emitting layer on the cathode side may be an electron injecting layer or a charge blocking layer. These layers are described in detail below.

(Formation of Organic Compound Layer)

In the organic electroluminescent element of the present invention, the layers constituting the organic compound layer each can be appropriately formed by any of a dry film forming method (e.g., vapor-deposition, sputtering), a transfer method, a printing method or the like.

(Light-Emitting Layer)

The light-emitting layer is a layer having a function of, when an electric field is applied, receiving a hole from the anode, hole injecting layer or hole transporting layer, and receiving an electron from the cathode, electron injecting layer or electron transporting layer, thereby providing a site for the recombination of a hole and an electron to emit light.

The light-emitting layer for use in the present invention contains at least one luminescent dopant and a plurality of host compounds.

The light-emitting layer may be a single layer or two or more layers. Each of the two or more layers may emit light with different emission color. When the light-emitting element includes a plurality of light-emitting layers, each of the light emitting layers preferably contains at least one luminescent dopant and a plurality of host compounds.

In the present invention, the luminescent dopant and the plurality of host compounds contained in the light-emitting layer are not particularly limited as long as the relationships of (1) $\Delta Ip$ ($=Ip(D)-Ip(H)min$)$>0$ eV and $\Delta Ea$ ($=Ea(H)max-Ea(D)$)$>0$ eV are satisfied.

That is, either a combination of a fluorescent dopant capable of providing light emission (fluorescence) from a singlet exciton with a plurality of host compounds or a combination of a phosphorescent dopant capable of providing light emission (phosphorescence) from a triplet exciton with a plurality of host compounds may be used, but in view of light emission efficiency, a combination of a phosphorescent dopant with a plurality of host compounds is preferred.

In the present invention, the light-emitting layer may contain two or more luminescent dopants so as to enhance color purity.

The luminescent dopant and the plurality of host compounds satisfying the relationships of (1) above for use in the present invention are described below.

When one luminescent dopant and a plurality of host compounds are used, the dopant must satisfy the condition that the $Ip(D)$ of the luminescent dopant is larger than the ionization potential $Ip(H)min$ of one host compound, that is, $Ip(D)>Ip(H)min$, and the $Ea(D)$ is smaller than the electron affinity of another host compound, that is, $Ea(H)max>Ea(D)$.

The host compound used for giving $Ip(H)min$ may be a hole transporting host, and the host compound used for giving $Ea(H)max$ may be an electron transporting host.

When a plurality of luminescent dopants are used, the $Ip(D)$ means the ionization potential of a dopant having a smallest Ip and the $Ea(D)$ means the electron affinity of a dopant having a largest Ea.

—Light-Emitting Dopant—

As for the luminescent dopant used in the present invention, any of a phosphorescent material, a fluorescent material and the like may be used as long as the relationships of (1) above are satisfied between the luminescent dopant and the plurality of host compounds.

In view of driving durability, the luminescent dopant for use in the present invention is preferably a dopant satisfying the relationships of (2), that is, 1.2 eV>$\Delta Ip$>0.2 eV and/or 1.2 eV/$\Delta Ea$>0.2 eV, with the host compounds.

=Phosphorescent Dopant=

Examples of the phosphorescent dopant in general include complexes containing a transition metal atom or a lanthanoid atom.

The transition metal atom is not particularly limited but preferred examples thereof include ruthenium, rhodium, palladium, tungsten, rhenium, osmium, iridium and platinum. Among these, rhenium, iridium and platinum are more preferred.

Examples of the lanthanoid atom include lanthanum, cerium, praseodymium, neodymium, samarium, europium, gadolinium, terbium, dysprosium, holmium, erbium, thulium, ytterbium and lutecium. Among these lanthanoid atoms, neodymium, europium and gadolinium are preferred.

Examples of the ligand of the complex include ligands described in G. Wilkinson et al., *Comprehensive Coordination Chemistry*, Pergamon Press (1987), H. Yersin, *Photochemistry and Photophysics of Coordination Compounds*, Springer-Verlag (1987), and Akio Yamamoto, *Yuki Kinzoku Kagaku—Kiso to Oyo—(Organic Metal Chemistry—Basics and Applications—)*, Shokabo (1982), the disclosures of which are incorporated by reference herein.

Specifically, the ligand is preferably a halogen ligand (preferably chlorine ligand), a nitrogen-containing heterocyclic ligand (e.g., phenylpyridine, benzoquinoline, quinolinol, bipyridyl, phenanthroline), a diketone ligand (e.g., acetylacetone), a carboxylic acid ligand (e.g., acetic acid ligand), a carbon monoxide ligand, an isonitrile ligand or a cyano ligand, more preferably a nitrogen-containing heterocyclic ligand.

The complex may contain one transition metal atom in the compound or may be a so-called binuclear complex having two or more transition metal atoms. Also, different metal atoms may be contained at the same time.

Of these phosphorescent dopants, specific examples of the luminescent dopant satisfying the relationships of (1) above include phosphorescent compounds described in U.S. Pat. No. 6,303,238B1, U.S. Pat. No. 6,097,147, WO 00/57676, WO 00/70655, WO 01/08230, WO 01/39234A2, WO 01/41512A1, WO 02/02714A2, WO 02/15645A1, WO 02/44189A1, JP-A Nos. 2001-247859, 2002-117978, 2002-235076, 2002-170684, EP 1211257, JP-A Nos. 2002-226495, 2002-234894, 2001-247859, 2001-298470, 2002-173674, 2002-203678, 2002-203679, the disclosures of which are incorporated by reference herein. Among these, the luminescent dopants satisfying the more preferred relationships of (2) are Ir complexes, Pt complexes, Cu complexes, Re complexes, W complexes, Rh complexes, Ru complexes, Pd complexes, Os complexes, Eu complexes, Tb complexes, Gd complexes, Dy complexes and Ce complexes. In particular, Ir complexes, Pt complexes and Re complexes are preferred, and Ir complexes, Pt complexes and Re complexes each containing at least one coordination mode of metal-carbon bond, metal-nitrogen bond, metal-oxygen bond and metal-sulfur bond are more preferred.

=Fluorescent Dopant=

Examples of the fluorescent dopant in general include benzoxazole, benzimidazole, benzothiazole, styrylbenzene, polyphenyl, diphenylbutadiene, tetraphenylbutadiene, naphthalimide, coumarin, pyran, perynone, oxadiazole, aldazine, pyralidine, cyclopentadiene, bisstyrylanthracene, quinacridone, pyrrolopyridine, thiadiazolopyridine, cyclopentadiene, styrylamine, aromatic dimethylidene compounds, condensed polycyclic aromatic compounds (e.g., anthracene, phenanthroline, pyrene, perylene, rubrene, pentacene), various metal complexes as represented by metal complexes of 8-quinolinol, pyrromethene complexes and rare earth complexes, polymer compounds such as polythiophene, polyphenylene and polyphenylene vinylene, organic silane, and derivatives thereof.

Among these compounds, specific examples of the luminescent dopant satisfying the relationships of (1) include the following compounds.

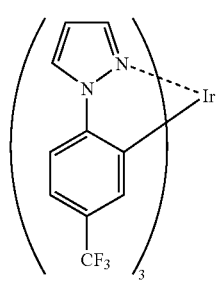
D-1

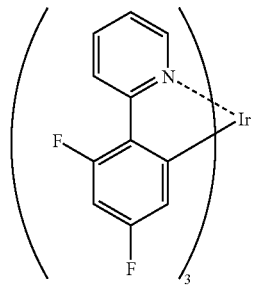
D-2

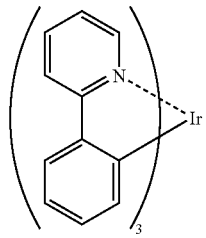
D-3

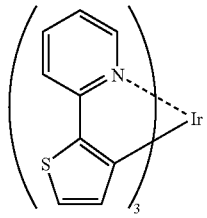
D-4

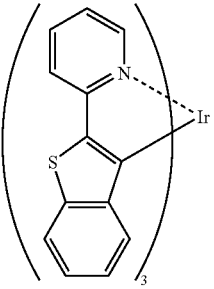
D-5

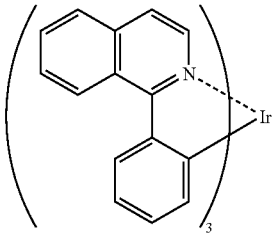
D-6

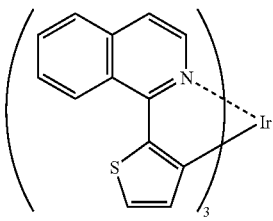
D-7

-continued
D-8
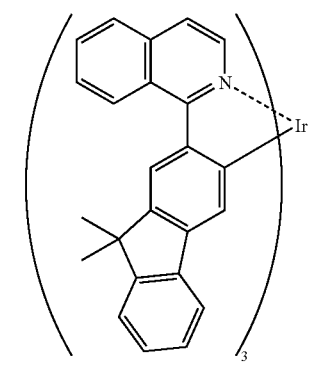
D-9
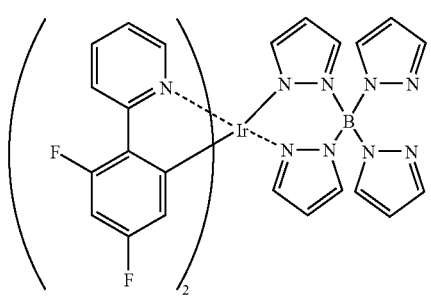
D-10
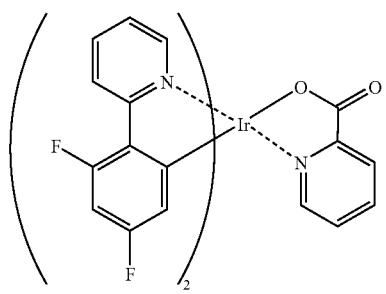
D-11
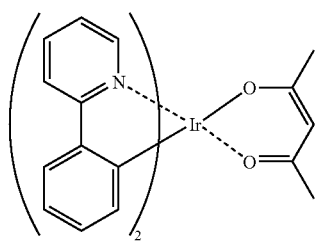
D-12
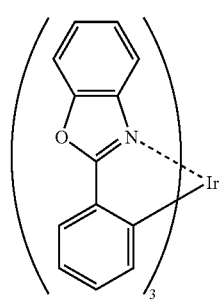
-continued
D-13
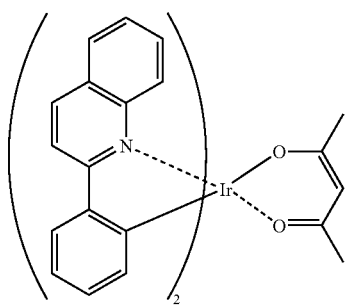
D-14
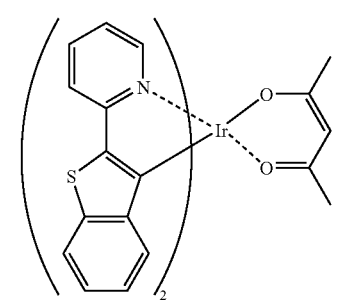
D-19
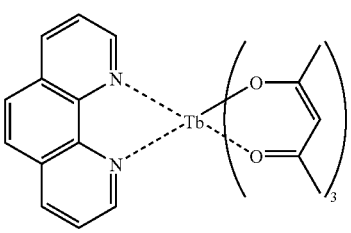
D-20
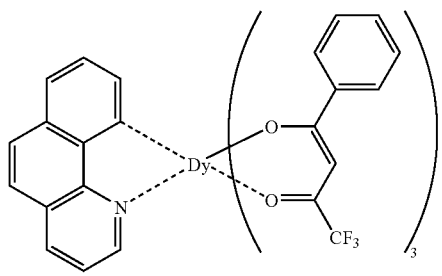
D-21
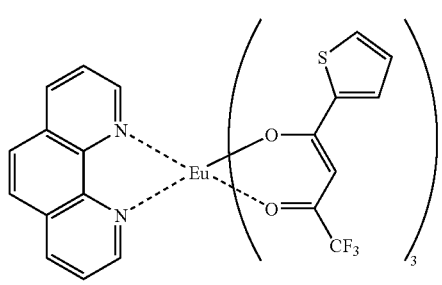

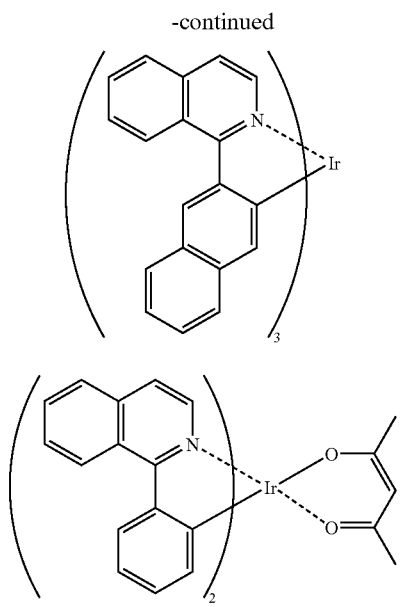

Among these compounds, the luminescent dopants satisfying the more preferred relationships of (2) are D-2, D-3, D-4, D-5, D-6, D-7, D-8, D-9, D-10, D-11, D-12, D-13 and D-14.

The luminescent dopant may be contained in the light-emitting layer generally in an amount of 0.1 to 20 mass % based on the mass of all compounds constituting the light-emitting layer, and in view of durability and light emission efficiency, the luminescent dopant is preferably contained in an amount of 1 to 15 mass %, and more preferably from 2 to 12 mass %.

The thickness of the light-emitting layer is not particularly limited but usually, the thickness is preferably from 1 nm to 500 nm, and in view of light emission efficiency, more preferably from 5 nm to 200 nm, and still more preferably from 10 to 100 nm.

—Host Compound—

As for the host compound used in the light-emitting layer, at least a plurality of host compounds are preferably used, but these host compounds are not particularly limited as long as the relationships of (1) $\Delta Ip(=Ip(D)-Ip(H)min)>0$ eV and $\Delta Ea$ $(=EA(H)max-Ea(D))>0$ eV are satisfied.

Of these ranges, the host compounds preferably satisfy the relationships of (2) 1.2 eV>$\Delta Ip$>0.2 eV and/or 1.2 eV>$\Delta Ea$>0.2 eV.

The plurality of host compounds may be hole transporting host compounds having excellent hole transporting properties (hole transporting host) or electron transporting host compounds having excellent electron transporting properties (electron transporting host).

=Hole Transporting Host=

The hole transporting host in the light-emitting layer for use in the present invention may be any known hole transporting material insofar as it satisfies the relationships of (1) $\Delta Ip(=Ip(D)-Ip(H)min)>0$ eV and $\Delta Ea$ $(=EA(H)max-Ea(D))>0$ eV. In view of durability and color purity, the ionization potential thereof is preferably from 4.6 to 7.5 eV, more preferably from 5.1 to 7.1 eV, and still more preferably from 5.4 to 7.1 eV.

Specific examples of such a hole transporting host include the following materials:

pyrrole, carbazole, triazole, oxazole, oxadiazole, imidazole, polyarylalkane, pyrazoline, pyrazolone, phenylenediamine, arylamine, amino-substituted chalcone, styrylanthracene, fluorenone, hydrazone, stilbene, silazane, aromatic tertiary amine compounds, styrylamine compounds, aromatic dimethylidene-based compounds, porphyrin-based compounds, polysilane-based compounds, poly(N-vinylcarbazole), aniline-based copolymers, thiophene oligomers, electrically conductive high molecular weight oligomers such as polythiophene, organic silanes, carbon films, and derivatives thereof.

Among these, preferred as the hole transporting host satisfying the relationships of (2) are carbazole derivatives, aromatic tertiary amine compounds and thiophene derivatives, and more preferred are those having a plurality of carbazole skeletons and/or aromatic tertiary amine skeletons within the molecule.

Specific examples of such a hole transporting host include the following compounds.

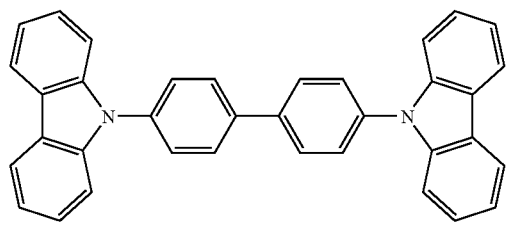

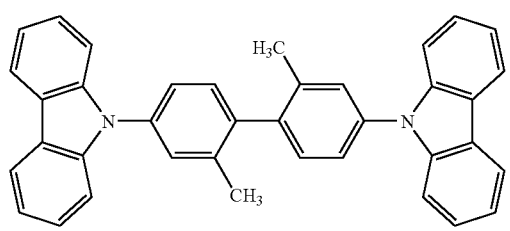

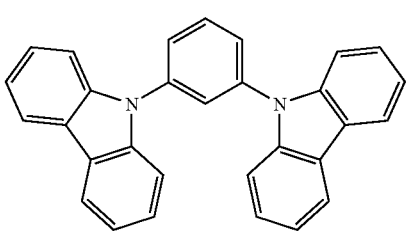

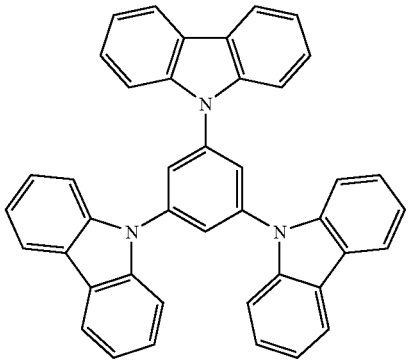

-continued
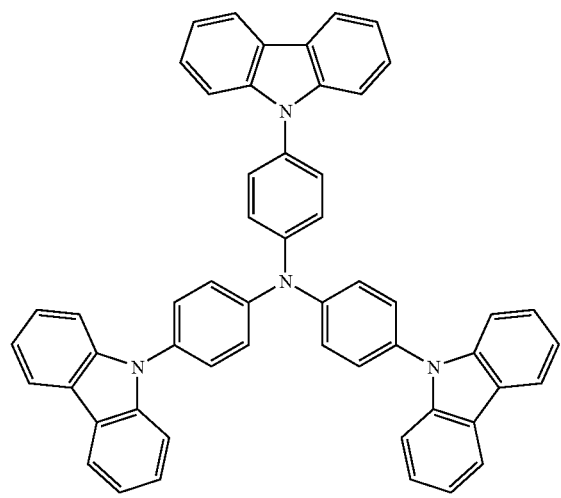
H-5
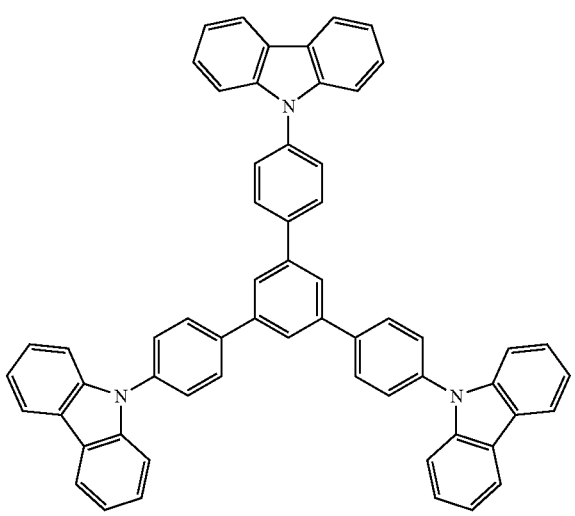
H-6
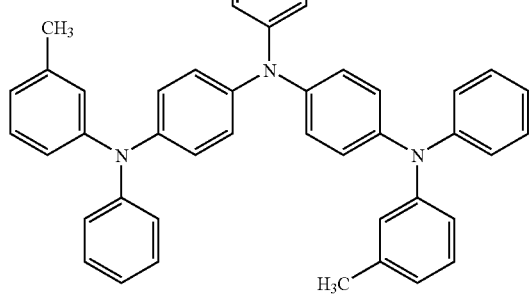
H-7
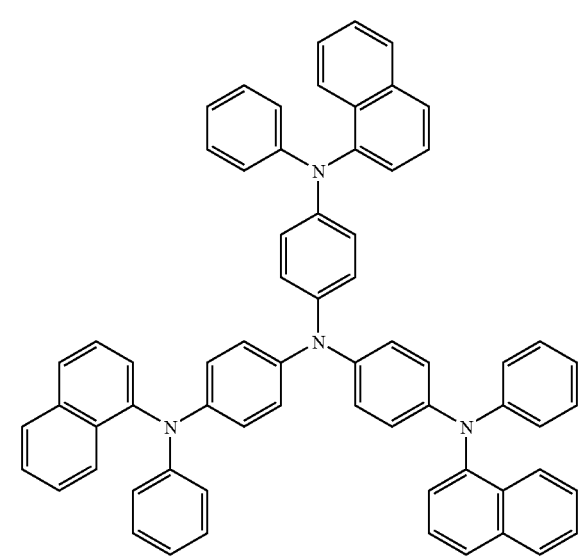
H-8
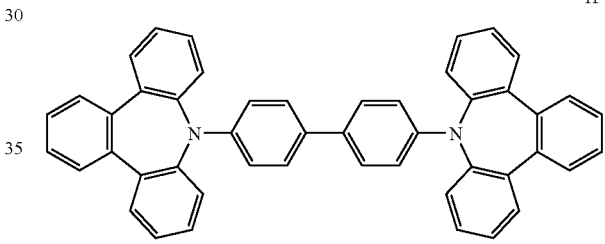
H-9
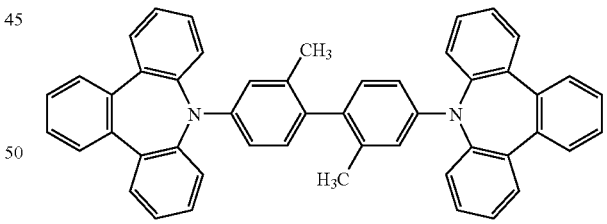
H-10
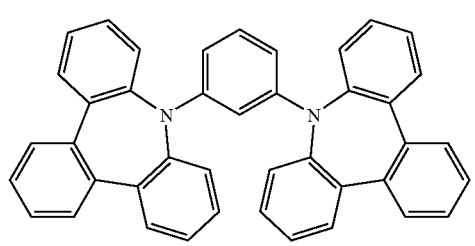
H-11

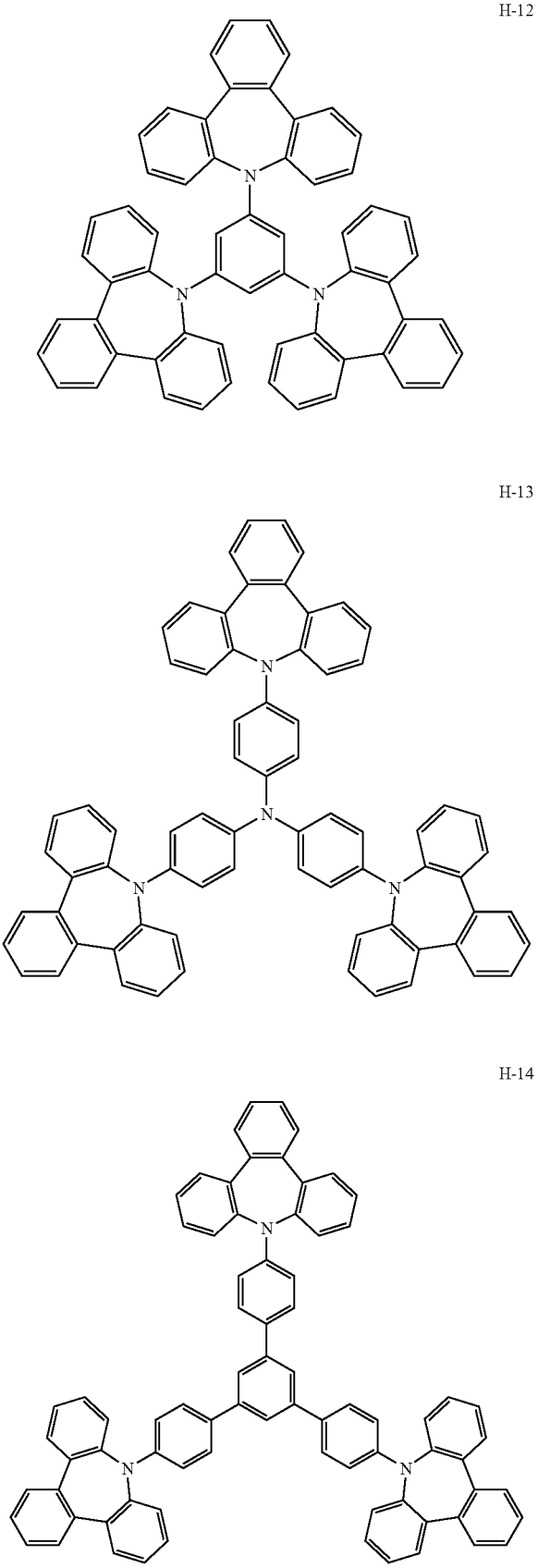
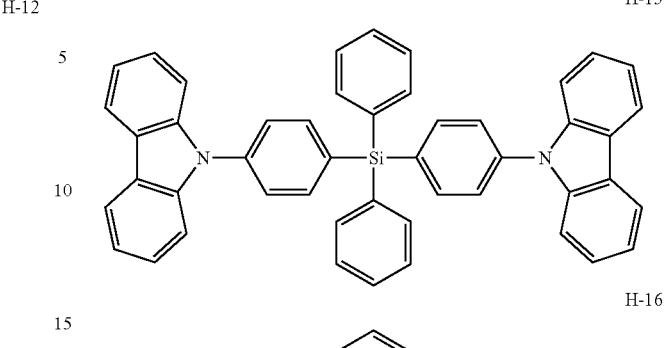

=Electron Transporting Host=

The electron transporting host in the light-emitting layer for use in the present invention may be any known electron transporting material insofar as it satisfies the relationships of (1). In view of durability and color purity, the electron affinity Ea thereof is preferably from 1.2 to 4.0 eV, more preferably from 1.2 to 3.4 eV, still more preferably from 1.2 to 3.0 eV, and yet still more preferably from 1.2 to 2.8 eV.

Specific examples thereof include the following materials: pyridine, pyrimidine, triazine, imidazole, triazole, oxazole, oxadiazole, fluorenone, anthraquinodimethane, anthrone, diphenylquinone, thiopyrandioxide, carbodiimide, fluorenylidenemethane, distyrylpyrazine, fluorine-substituted aromatic compounds, anhydrides or imides of aromatic tetracarboxylic acid (examples of aromatic ring thereof include naphthalene and perylene), anhydrides or imides of aromatic dicarboxylic acid (examples of aromatic ring thereof include benzene and naphthalene), phthalocyanine, derivatives thereof (may form a condensed ring with another ring), and various metal complexes as represented by a metal complex of 8-quinolinol derivative, metal phthalocyanine and a metal complex with the ligand being benzoxazole or benzothiazole.

Among these electron transporting hosts, metal complexes, azole derivatives (e.g., benzimidazole derivative, imidazopyridine derivative) and azine derivatives (e.g., pyridine derivative, pyrimidine derivative, triazine derivative) are preferred, and in view of durability, metal complex compounds are more preferred in the present invention. The metal complex compound (A) is a metal complex in which a ligand containing at least one nitrogen atom, oxygen atom or sulfur atom is coordinated to the metal. The metal ion in the metal complex is not particularly limited but is preferably beryllium ion, magnesium ion, aluminum ion, gallium ion, zinc ion, indium ion or tin ion, more preferably beryllium ion, aluminum ion, gallium ion or zinc ion, still more preferably aluminum ion or zinc ion.

As for the ligand contained in the metal complex, various ligands are known, and examples thereof include the ligands described in H. Yersin, *Photochemistry and Photophysics of Coordination Compounds*, Springer-Verlag (1987), and Akio Yamamoto, *Yuki Kinzoku Kagaku—Kiso to Oyo—(Organic Metal Chemistry—Basics and Applications—)*, Shokabo (1982), the disclosures of which are incorporated by reference herein.

The ligand is preferably a nitrogen-containing heterocyclic ligand (preferably having from 1 to 30 carbon atoms, more preferably from 2 to 20 carbon atoms, still more preferably from 3 to 15 carbon atoms. This may be a unidentate ligand or a bidentate or greater polydentate ligand but is preferably a bidentate ligand and examples thereof include pyridine ligands, bipyridyl ligands, quinolinol ligands and hydroxphenylazole ligands (e.g., hydroxyphenylbenzimidazole ligand, hydroxyphenylbenzoxazole ligand, hydroxyphenylimidazole ligand)), an alkoxy ligand (preferably having from 1 to 30 carbon atoms, more preferably from 1 to 20 carbon atoms, still more preferably from 1 to 10 carbon atoms, such as methoxy, ethoxy, butoxy and 2-ethylhexyloxy), an aryloxy ligand (preferably having from 6 to 30 carbon atoms, more preferably from 6 to 20 carbon atoms, still more preferably from 6 to 12 carbon atom, such as phenyloxy, 1-naphthyloxy, 2-naphthyloxy, 2,4,6-trimethylphenyloxy and 4-biphenyloxy), a heteroaryloxy ligand (preferably having from 1 to 30 carbon atoms, more preferably from 1 to 20 carbon atoms, still more preferably from 1 to 12 carbon atoms, such as pyridyloxy, pyrazyloxy, pyrimidyloxy and quinolyloxy), an alkylthio ligand (preferably having from 1 to 30 carbon atoms, more preferably 1 to 20 carbon atoms, still more preferably from 1 to 12 carbon atoms, such as methylthio and ethylthio), an arylthio ligand (preferably having from 6 to 30 carbon atoms, more preferably 6 to 20 carbon atoms, still more preferably from 6 to 12 carbon atoms, such as phenylthio), a heteroarylthio ligand (preferably having from 1 to 30 carbon atoms, more preferably 1 to 20 carbon atoms, still more preferably from 1 to 12 carbon atoms, such as pyridylthio, 2-benzimidazolylthio, 2-benzoxazoylthio and 2-benzothiazolylthio) or a siloxy ligand (preferably having from 1 to 30 carbon atoms, more preferably from 3 to 25 carbon atoms, still more preferably from 6 to 20 carbon atoms, such as triphenylsiloxy, triethoxysiloxy and triisopropylsiloxy), more preferably a nitrogen-containing heterocyclic ligand, an aryloxy ligand, a heteroaryloxy ligand or a siloxy ligand, still more preferably a nitrogen-containing heterocyclic ligand, an aryloxy ligand or a siloxy ligand.

Specific examples of such an electron transporting host include the following materials.

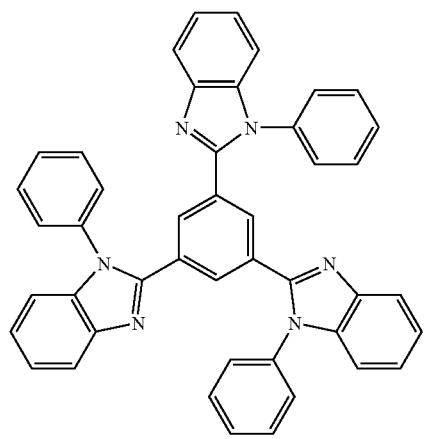

E-1

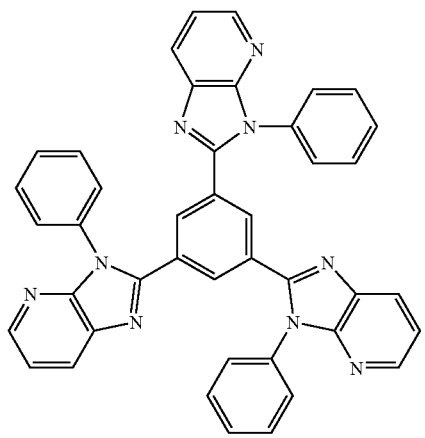

E-2

-continued

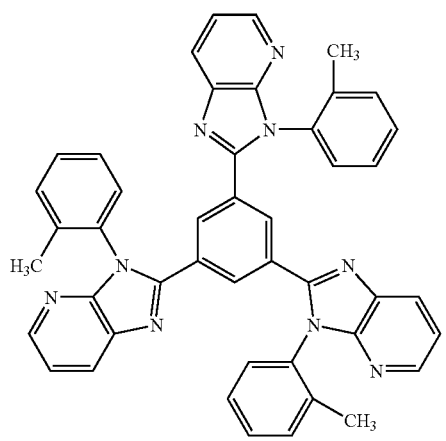

E-3

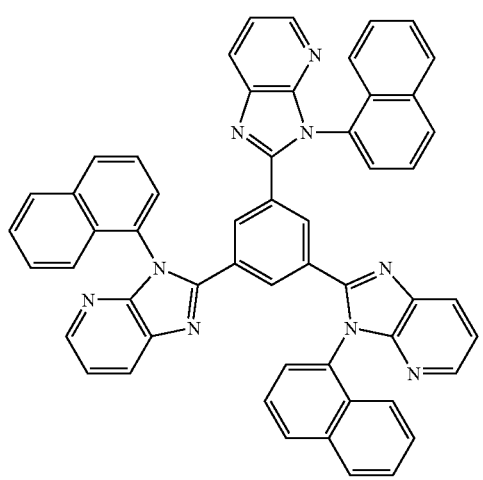

E-4

-continued

E-5
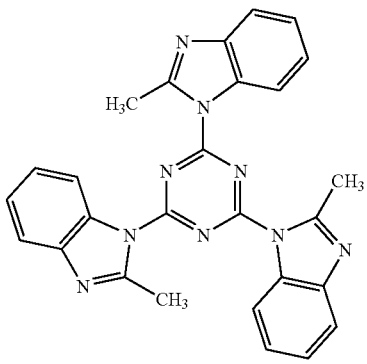

E-6
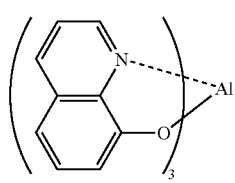

E-7

E-8
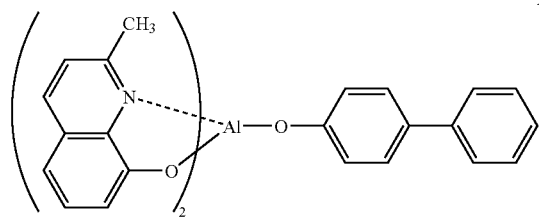

E-9
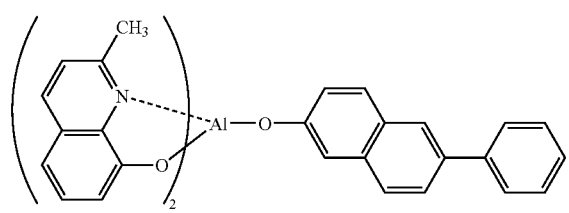

-continued

E-10
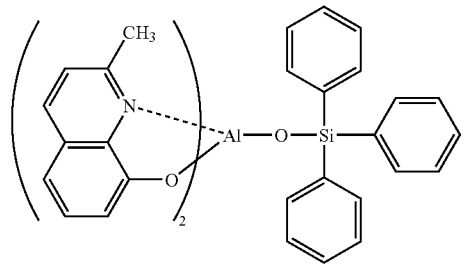

E-11
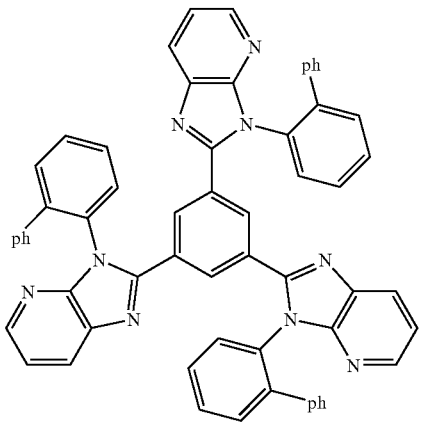

E-12
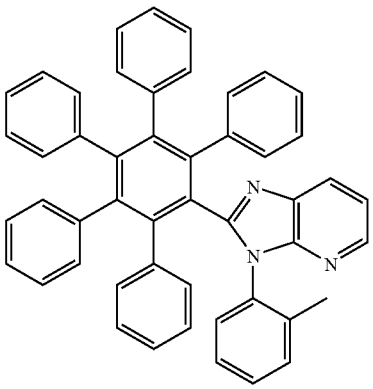

Among these, preferred as the electron transporting host satisfying the relationships of (2) are E-1 to E-6, and more preferred is E-3.

In the light-emitting layer for use in the present invention, when a phosphorescent dopant is used as the luminescent dopant, the minimum triplet excitation energy T1(D) of the phosphorescent dopant and the minimum value T1(H)min out of the minimum triplet excitation energies of the plurality of host compounds preferably satisfy a relationship of T1(H)min>T1(D) in terms of color purity and light emission efficiency, more preferably satisfy a relationship of T1(H)min−T1(D)>0.1 eV, and still more preferably satisfy a relationship of T1(H)min−T1(D)>0.2 eV.

The content of each of the plurality of host compounds for use in the present invention is not particularly limited but, in view of driving durability, is preferably from 15 to 85 mass % based on the mass of all compounds constituting the light-emitting layer. The content of each of the plurality of host compounds is more preferably from 20 to 80 mass %, and still more preferably from 25 to 75 mass % based on the mass of all compounds constituting the light emitting layer. The content of each of the host compounds based on the mass of all host compounds contained in the light emitting layer is not particularly limited, but is preferably from 5 to 95 mass %, more preferably from 10 to 90 mass %, and still more preferably from 15 to 85 mass %.

Examples of preferable combinations of the host compound and the luminescent dopant include: the combination of a hole transporting host selected from H-1 to H-16, an electron transporting host selected from E-1 to E-12, and a luminescent dopant selected from D-1 or D-3; and the combination of hole transporting host H-10, electron transporting host E-12 and luminescent dopant D-10. Among the above described combinations, the combination of a hole transporting host selected from H-1, H-3, H-4, H-7 or H-8, an electron transporting host selected from E-1 or E-11, and a luminescent dopant selected from D-1 or D-3, and the combination of hole transporting host H-10, electron transporting host E-12 and luminescent dopant D-10 are more preferable.

The carrier mobility in the light-emitting layer may be generally from $10^{-7}$ to $10^{-1}$ cm$^2$V/s and in view of light emission efficiency, preferably from $10^{-5}$ to $10^{-1}$ m$^2$/Vs, more preferably from $10^{-4}$ to $10^{-1}$ cm$^2$/Vs, and still more preferably from $10^{-3}$ to $10^{-1}$ cm$^2$/Vs.

In view of driving durability, the carrier mobility in the light-emitting layer is preferably smaller than the carrier mobility in the carrier transporting layer, which is described below.

As for the carrier mobility, a value obtained by the measurement according to the TOF method (time-of-flight method) is used as the carrier mobility. The TOF method is described in "*Hikari Denshi Kinou Yukizairyo Handbook (Photo/Electronic Functional Organic Material Handbook)*" edited by Kazuyuki Horie, published by Asakura Shoten (1995), page 287, the disclosure of which is incorporated by reference herein.

(Hole Injecting Layer and Hole Transporting Layer)

The hole injecting layer and the hole transporting layer each have the function of receiving a hole from an anode or an anode side and of transporting the hole to the cathode side.

The hole injecting layer and the hole transporting layer each preferably include, for example, a carbazole derivative, a triazole derivative, an oxazole derivative, an oxadiazole derivative, an imidazole derivative, a polyarylalkane derivative, a pyrazoline derivative, a pyrazolone derivative, a phenylenediamine derivative, an arylamine derivative, an amino-substituted derivative, a styrylanthracene derivative, a fluorenone derivative, a hydrazone derivative, a stilbene derivative, a silazane derivative, an aromatic tertiary amino compound, a styrylamine compound, an aromatic dimethylidyne-based compound, a porphiryn-based compound, an organic silane derivative, carbon, or the like.

The thickness of a hole injecting layer or a hole transporting layer is not particularly limited, but is preferably from 1 nm to 5 μm, more preferably from 5 nm to 1 μm, and still more preferably from 10 nm to 500 nm.

A hole injecting layer or a hole transporting layer may be a single layer structure comprising one kind or two or more kinds of the aforementioned materials, or may also be a multilayer structure comprising a plurality of layers of the same composition or different compositions.

When the carrier transporting layer adjacent to the light-emitting layer is a hole transporting layer, in view of driving durability, the Ip(HTL) of the hole transporting layer is preferably smaller than the IP(D) of the dopant contained in the light-emitting layer. It is more preferable that the relationship of Ip(D)−Ip(HTL)>0.1 eV is satisfied, and still more preferably, the relationship of Ip(D)−Ip(HTL)>0.2 eV is satisfied.

The Ip(HTL) of the hole transporting layer can be measured by the above-described measurement method for the Ip.

The carrier mobility in the hole transporting layer may be generally from $10^{-7}$ to $10^{-1}$ cm$^2$/Vs and in view of light emission efficiency, preferably from $10^{-5}$ to $10^{-1}$ m$^2$/Vs, more preferably from $10^{-4}$ to $10^{-1}$ cm$^2$/Vs, and still more preferably from $10^{-3}$ to $10^{-1}$ cm$^2$/Vs.

As for the carrier mobility, a value measured by the same method as the measurement method for the carrier mobility in the light-emitting layer is employed.

Also, in view of driving durability, the carrier mobility in the hole transporting layer is preferably larger than the carrier mobility in the light-emitting layer.

(Electron Injecting Layer and Electron Transporting Layer)

The electron injecting layer and the electron transporting layer are each a layer having any one function of receiving an electron from the cathode, transporting an electron, or blocking a hole which is injectable from the anode.

Specific examples of the material for the electron injecting layer and the electron transporting layer include pyridine, pyrimidine, triazine, imidazole, triazole, oxazole, oxadiazole, fluorenone, anthraquinodimethane, anthrone, diphenylquinone, thiopyrandioxide, carbodiimide, fluorenylidenemethane, distyrylpyrazine, fluorine-substituted aromatic compounds, anhydrides or imides of aromatic tetracarboxylic acid (examples of aromatic ring thereof include naphthalene and perylene), anhydrides or imides of aromatic dicarboxylic acid (examples of aromatic ring thereof include benzene and naphthalene), phthalocyanine, derivatives thereof (may form a condensed ring with another ring), and various metal complexes as represented by a metal complex of 8-quinolinol derivative, metal phthalocyanine and a metal complex with the ligand being benzoxazole or benzothiazole.

The electron injecting layer and the electron transporting layer are not particularly limited in their thickness but usually, from the standpoint of decreasing the driving voltage, the thickness is preferably from 1 nm to 5 μm, more preferably from 5 nm to 1 μm, and still more preferably from 10 nm to 500 nm.

The electron injecting layer and the electron transporting layer each may have a single-layer structure comprising one kind or two or more kinds of the above-described materials or may have a multilayer structure comprising a plurality of layers having the same composition or differing in composition.

When the carrier transporting layer adjacent to the light-emitting layer is an electron transporting layer, in view of driving durability, the Ea(ETL) of the electron transporting layer is preferably larger than the Ea(D) of the dopant contained in the light-emitting layer. It is more preferable that the relationship of Ea(ETL)−Ea(D)>0.1 eV is satisfied, and still more preferably, the relationship of Ea(ETL)−Ea(D)>0.2 eV is satisfied.

As for the Ea(ETL), a value measured by the same method as the above-described measurement method for the Ea is employed.

The carrier mobility in the electron transporting layer may be generally from $10^{-7}$ to $10^{-1}$ cm$^2$/Vs and in view of light emission efficiency, preferably from $10^{-5}$ to $10^{-1}$ m$^2$/Vs, more preferably from $10^{-4}$ to $10^{-1}$ cm$^2$/Vs, and still more preferably from $10^{-3}$ to $10^{-1}$ cm$^2$/Vs.

Also, in view of driving durability, the carrier mobility in the electron transporting layer is preferably larger than the carrier mobility in the light-emitting layer. The carrier mobility here is measured by the same method as that for the carrier mobility in the hole transporting layer.

With respect to the carrier mobility of the light-emitting element of the present invention, in view of driving durability, the carrier mobility among the hole transporting layer, the electron transporting layer and the light-emitting layer is preferably (electron transporting layer≧hole transporting layer)>light-emitting layer.

(Hole Blocking Layer)

The hole blocking layer is a layer having a function of preventing a hole which is transported from the anode side to the light-emitting layer, from passing through to the cathode side. In the present invention, the hole blocking layer can be provided as an organic compound layer adjacent to the light-emitting layer on the cathode side.

The hole blocking layer is not particularly limited but specifically, may comprise an aluminum complex (e.g., $BAlq_2$), a triazole derivative, a pyrazabole derivative or the like.

In order to decrease the drive voltage, the thickness of the hole blocking layer in general is preferably 50 nm or less, more preferably from 1 to 50 nm, and still more preferably from 5 to 40 nm.

(Anode)

The anode may usually serve as an electrode that supplies holes to the organic compound layer. The shape, structure, size and the like of the anode are not particularly limited and can be selected as appropriate from well known electrodes depending on the applications and purposes of a light-emitting element. As mentioned supra, the anode is usually formed as a transparent anode.

Examples of the material of the anode that are suitable include metals, alloys, metal oxides, electric conductive organic compounds and mixtures thereof, which preferably have a work function of 4.0 eV or more. Specific examples the material of the anode include electric conductive metal oxides such as tin oxides doped with antimony or fluorine (ATO, FTO), tin oxide, zinc oxide, indium oxide, indium tin oxide (ITO), and indium zinc oxide (IZO); metals such as gold, silver, chromium, and nickel; mixtures or laminates of these metals and electric conductive metal oxides; electric conductive inorganic substances such as copper iodide and copper sulfate; electric conductive organic materials such as polyaniline, polythiophene, and polypyrrole; laminates and the like of these and ITO. Among them, the material of the anode is preferably an electric conductive metal oxide, and more preferably ITO from the viewpoint of productivity, high electric conductivity, transparency and the like.

An anode can be formed on the above-described substrate in accordance with a method selected, as appropriate, in consideration of its suitability to the materials constituting the above-described anode, from wet methods such as the printing method and the coating method, physical methods such as the vacuum deposition method, the sputtering method and the ion plating method, chemical methods such as CVD and the plasma CVD method, and the like. For instance, when ITO is selected as the material of the anode, the formation of the anode can be carried out according to the direct current or high-frequency sputtering method, the vacuum deposition method, the ion plating method or the like.

In the organic electroluminescent element of the invention, the position of the anode to be formed is not particularly limited and can be selected as necessary depending on the applications or purposes of the light-emitting element. The anode may be formed on the entire surface of one surface of the substrate, or may also be formed on a portion thereof.

The patterning for forming the anode may be carried out by chemical etching such as photolithography, or may also be carried out by physical etching such as by means of a laser, or may also be carried out by vacuum deposition or sputtering after placing a mask, or may also be carried out by the lift-off method or the printing method.

The thickness of the anode can be selected, as appropriate, depending on the material constituting the above-described anode, cannot be specified unconditionally, may be usually from 10 nm to 50 µm, and is preferably from 50 nm to 20 µm.

The resistance value of the anode is preferably $10^3$ Ω/sq or less, and more preferably $10^2$ Ω/sq or less. When the anode is a transparent anode, the anode may be colorless transparent or may also be colored transparent. For the extraction of light emission from the anode side, the transmittance is preferably 60% or more, and more preferably 70% or more.

Additionally, transparent anodes which can be applied to the present invention are described in detail in "*Tohmeidodenmaku No Shintenkai* (*Developments of Transparent Conductive Films*)" edited by Yutaka Sawada, published by CMC (1999), the disclosure of which is incorporated by reference herein. When a plastic substrate of low heat resistance is used, ITO or IZO is employed, and a transparent anode that is film formed at a low temperature of 150° C. or less is preferable.

Cathode

The cathode may usually serve as an electrode that injects an electron to an organic compound layer. The shape, structure, size and the like are not particularly limited and can be selected as appropriate from well known electrodes depending on the applications and purposes of a light-emitting element.

Examples of the material of the cathode include metals, alloys, metal oxides, electric conductive compounds and mixtures thereof, and preferably have a work function of 4.5 eV or less. Specific examples include alkali metals (e.g., Li, Na, K, Cs and the like), alkali earth metals (e.g., Mg, Ca, and the like), gold, silver, lead, aluminum, sodium-potassium alloy, lithium-aluminum alloy, magnesium-silver alloy, indium, rare earth metals such as ytterbium, and the like. These may be used singly and can be used in combination of two or more kinds from the standpoint of compatibility between stability and electron injection properties.

Among them, preferable examples of the material of the cathode include alkali metals and alkali earth metals in terms of electron injection properties and include materials primarily made of aluminum in terms of excellent shelf life.

A material primarily made of aluminum as used herein means aluminum alone, or an alloy of aluminum and a 0.01 to 10% by mass alkali metal or alkali earth metal or a mixture thereof (e.g., lithium-aluminum alloy, magnesium-aluminum alloy, and the like).

In addition, materials of the cathode are described in JP-A Nos. 2-15595 and 5-121172, the disclosures of which are incorporated by reference herein, and the materials described in these gazettes can also be applied to the invention.

Methods of forming the cathode are not particularly limited and can be carried out in accordance with well known methods. For instance, a cathode can be formed in accordance with a method selected, as appropriate, in consideration of its suitability to the materials constituting the above-described cathode, from wet methods such as the printing method and the coating method; physical methods such as the vacuum deposition method, the sputtering method and the ion plating method; chemical methods such as CVD and the plasma CVD method; and the like. For example, when metals and the like are selected as materials of the cathode, the formation can be carried out with one kind thereof or two or more kinds thereof at the same time or one by one in accordance with the sputtering method or the like.

The patterning for forming the cathode may be carried out by chemical etching such as photolithography, or may also be carried out by physical etching such as by means of a laser, or may also be carried out by vacuum deposition or sputtering after placing a mask, or may also be carried out by the lift-off method or the printing method.

In the invention, the position of a cathode to be formed is not particularly limited and may be formed on the entire organic compound layer, or may also be formed on a portion thereof.

Also, a dielectric layer with a thickness of 0.1 nm to 5 nm made of a fluoride or an oxide of an alkali metal or an alkali earth metal, or the like, may be inserted between the cathode and the organic compound layer. This dielectric layer can be considered to be a kind of electron injecting layer. The dielectric layer can be formed by, for example, the vacuum deposition method, the sputtering method, the ion plating method or the like.

The thickness of a cathode can be selected, as appropriate, depending on the material constituting the above-described cathode, cannot be specified unconditionally, may be normally from 10 nm to 5 µm, and is preferably from 50 nm to 1 µm.

The cathode may be transparent or may be opaque. A transparent cathode can be formed by a process that involves thinly film-forming the material constituting the above-described cathode to a thickness of from 1 to 10 nm, and then laminating thereon a transparent, electric conductive material of the aforementioned ITO, IZO, or the like.

(Substrate)

In the invention a substrate can be used. The substrate to be used in the invention is preferably a substrate that does not scatter or attenuate light emitted from an organic compound layer. Specific examples of the substrate include inorganic materials such as Yttria-stabilized Zirconia (YSZ) and glass; polyesters such as polyethylene terephthalate, polybutylene phthalate, and polyethylene naphthalate; and organic materials such as polystyrene, polycarbonate, polyether sulfone, polyallylate, polyimides, polycycloolefins, norbornene resin, and poly(chlorotrifluoroethylene).

When the substrate is made of glass, the glass is preferably no-alkali glass in order to reduce ions deriving from the glass. When the substrate is made of soda lime glass, the substrate is preferably coated with a barrier coating such as silica. When an organic material is used, the material is preferably excellent in heat resistance, dimension stability, solvent resistance, electric insulation and processability.

The shape, structure, size and the like of a substrate are not particularly limited and can be selected as appropriate depending on the applications, purposes and the like of a light-emitting element. In general, the shape is preferably board-shaped. The structure of the substrate may be a single-layer structure or may also be a laminated structure. The substrate may be fabricated with a single member or may also be formed with two or more members.

The substrate may be colorless transparent or may also be colored transparent, and is preferably colorless transparent in terms of no scattering or attenuation of the light emitted from the light-emitting layer.

A moisture penetration resistance layer (gas barrier layer) can be formed on the surface or the back (the aforementioned transparent electrode side) of the substrate.

Materials for the moisture penetration resistance layer (gas barrier layer) that are suitably used include inorganic substances such as silicon nitride and silicon oxide. The moisture penetration resistance layer (gas barrier layer) can be formed by, for example, the radio-frequency (high-frequency) sputtering process or the like.

When a thermoplastic substrate is used, the substrate may be further equipped with a hard coat layer or an undercoat layer as required.

(Protective Layer)

In the invention, the whole organic EL element may be protected by a protective layer.

Any material may be contained in the protective layer insofar as it has the ability to prevent the intrusion of materials, such as water and oxygen, which promote the deterioration of the element, into the element.

Specific examples of the material of the protective layer include metals such as In, Sn, Pb, Au, Cu, Ag, Al, Ti and Ni; metal oxides such as MgO, SiO, $SiO_2$, $Al_2O_3$, GeO, NiO, CaO, BaO, $Fe_2O_3$, $Y_2O_3$, and $TiO_2$; metal nitrates such as SiNx and SiNxOy; metal fluorides such as $MgF_2$, LiF, $AlF_3$ and $CaF_2$; polyethylene, polypropylene, polymethylmethacrylate, a polyimide, polyurea, polytetrafluoroethylene, polychlorotrifluoroethylene, polydichlorodifluoroethylene and copolymers of chlorotrifluoroethylene and dichlorodifluoroethylene; copolymers obtained by copolymerization of a monomer mixture including tetrafluoroethylene and at least one kind of comonomer; fluorine-containing copolymers having a ring structure on the copolymer backbone thereof; water absorptive materials having a water absorption of 1% or more; moisture-proof materials having a water absorption of 0.1% or less; and the like.

A process of forming the protective layer is not particularly limited. Examples of a method that can be used include a vacuum deposition process, a sputtering process, a reactive sputtering process, a MBE (molecular beam epitaxy) process, a cluster ion beam process, a ion plating process, a plasma polymerization process (the high-frequency excited ion plating process), a plasma CVD process, a laser CVD process, a thermal CVD process, a gas source CVD process, a coating process, a printing process, and a transfer process.

(Sealing)

Furthermore, in the organic electroluminescent element of the invention, the entire element may be sealed with a sealing container.

Also, the space between the sealing container and the luminescent element may be filled with a moisture absorbent or an inert liquid. The moisture absorbent is not particularly limited. Specific examples of the moisture absorbent include barium oxide, sodium oxide, potassium oxide, calcium oxide, sodium sulfate, calcium sulfate, magnesium sulfate, phosphorus pentaoxide, calcium chloride, magnesium chloride, copper chloride, cesium fluoride, niobium fluoride, calcium bromide, vanadium bromide, a molecular sieve, zeolite, magnesium oxide, and the like. An inert liquid is not particularly limited and the examples include paraffins, liquid paraffins, fluorine-based solvents such as perfluoroalkanes, perfluoroamines and perfluoroethers, chlorine-based solvents, and silicone oils.

In the organic electroluminescent element of the present invention, a DC (which, if desired, may contain an AC component) voltage (usually from 2 to 15 V) or a DC current is applied between the anode and the cathode, whereby light emission can be obtained.

In the present invention, the driving durability of the organic electroluminescent element can be measured by the brightness half-life time at a specific brightness. For example, a DC voltage is applied to the organic EL element to cause light emission by using the Source Measure Unit Model 2400 manufactured by KEITHLEY, a continuous driving test is performed under the condition of the initial brightness being 2,000 cd/m$^2$, the time period until the brightness decreases to 1,000 cd/m$^2$ is determined as the brightness half-life time T($\frac{1}{2}$), and this brightness half-life time is compared with that of a conventional light-emitting element. The numerical value thus obtained is used as the brightness half-life time in the present invention.

An important characteristic value of the organic electroluminescent element is its external quantum efficiency. The external quantum efficiency is calculated according to "external quantum efficiency $\phi$=number of photons released from element/number of electrons injected to element". The larger this value, the more advantageous the element in view of electric power consumption.

The external quantum efficiency of the organic electroluminescent element is also determined according to "external quantum efficiency $\phi$=internal quantum efficiency×light extraction efficiency". In the organic EL element utilizing fluorescence emitted from an organic compound, the limit value of internal quantum efficiency is 25%, the light extraction efficiency is about 20% and, therefore, the limit value of the external quantum efficiency is considered to be about 5%.

The external quantum efficiency of the element is preferably 6% or more, and more preferably 12% or more, because reduction in the power consumption and elevation of the driving durability can thus be realized.

As for the numerical value of the external quantum efficiency, a maximum value of external quantum efficiency when the element is driven at 20° C., or a value of external quantum efficiency in the vicinity of 100 to 300 cd/m$^2$ (preferably 200 cd/m$^2$) when the element is driven at 20° C., can be used.

In the present invention, the external quantum efficiency obtained as follows may be used: a constant DC voltage is applied to an EL element to cause light emission by using Source Measure Unit Model 2400 manufactured by Toyo Corporation, the brightness is measured by using Brightness Meter BM-8 manufactured by Topcon Corporation, the external quantum efficiency at 200 cd/m$^2$ is calculated, and the value obtained is used.

The external quantum efficiency of the light-emitting element can also be calculated from the measured values of light emission brightness, light emission spectrum and current density, and the relative luminosity curve. More specifically, the number of electrons input can be calculated by using the current density value. Then, the light emission brightness can be converted into the number of photons which are emitted as light by integral computation using the light emission spectrum and relative luminosity curve (spectrum), and from the values obtained, the external quantum efficiency (%) can be calculated according to "(number of photons which are emitted as light/number of electrons input into element)×100".

The driving of an organic electroluminescent element of the invention can utilize methods described in, for example, JP-A Nos. 2-148687, 6-301355, 5-29080, 7-134558, 8-234685 and 8-241047, Japanese Patent No. 2784615, and U.S. Pat. Nos. 5,828,429 and 602,330, the disclosures of which are incorporated by reference herein.

The organic EL element of the invention can be suitably used in the fields of display devices, displays, backlights, electrophotography, light sources for illumination, light sources for recording, light sources for exposure, light sources for reading, signs, sign boards, interiors, optical communications, and the like.

EXAMPLES

The present invention is described below with reference to Examples, but the present invention is not limited thereto.

Example 1

On a 2.5 cm-square glass substrate with a thickness of 0.5 mm, an ITO thin film (thickness: 0.2 µm) was formed as a transparent anode by DC magnetron sputtering (conditions: substrate temperature of 100° C., oxygen pressure of 1×10$^{-3}$ Pa) using an ITO target having an In$_2$O$_3$ content of 95 mass %. The surface resistance of the ITO thin film was 10 Ω/square.

The substrate having the transparent anode formed thereon was placed in a washing vessel and subjected to IPA washing and then to UV-ozone treatment for 30 minutes. On this transparent anode, copper phthalocyanine was deposited at a rate of 0.5 nm/sec by a vacuum deposition method to provide a hole injecting layer of 10 nm.

On this hole injecting layer, 4,4',4"-tris(2-methyl-phenylphenylamino)triphenylamine (m-MTDATA) was deposited at a rate of 0.5 nm/sec by a vacuum deposition method to provide a hole transporting layer of 40 nm.

On this hole transporting layer, m-MTDATA, an electron transporting host 1 shown below, and Iridium Complex 1 (Ir Complex 1) shown below were co-deposited as a hole transporting material in the light-emitting layer, an electron transporting material in the light-emitting layer, and a luminescent material, respectively, at a ratio of 50/50/8 by a vacuum deposition method to obtain a light-emitting layer of 30 nm.

On the light-emitting layer, BAlq$_2$ was deposited as an electron transporting material in the electron transporting layer to 10 nm at a rate of 0.5 nm/sec by a vacuum deposition method and thereon, Alq$_3$ was deposited as an electron transporting material at a rate of 0.2 nm/sec by a vacuum deposition method to provide an electron transporting layer of 35 nm.

On this electron transporting layer, a patterned mask with a square opening to give a light-emitting area of 2 mm×2 mm was placed, and lithium fluoride was deposited by a vacuum deposition method to provide an electron injecting layer of 1 nm.

On this electron injecting layer, aluminum was deposited by a vacuum deposition method to provide a cathode of 0.15 µm.

An aluminum lead wire was connected to each of the anode and the cathode provided above, whereby a light-emitting lamination body was formed.

This light-emitting lamination body was placed in a glove box purged with an argon gas, and then sealed by using a stainless steel-made sealing can having a desiccant provided therein as well as an ultraviolet-curable adhesive (XNR5516HV, produced by Nagase ChemteX Corporation) to obtain a light-emitting element of the present invention.

The operation from the vapor deposition of copper phthalocyanine until the sealing was performed in vacuum or in a nitrogen atmosphere to produce the element without any exposure to air.

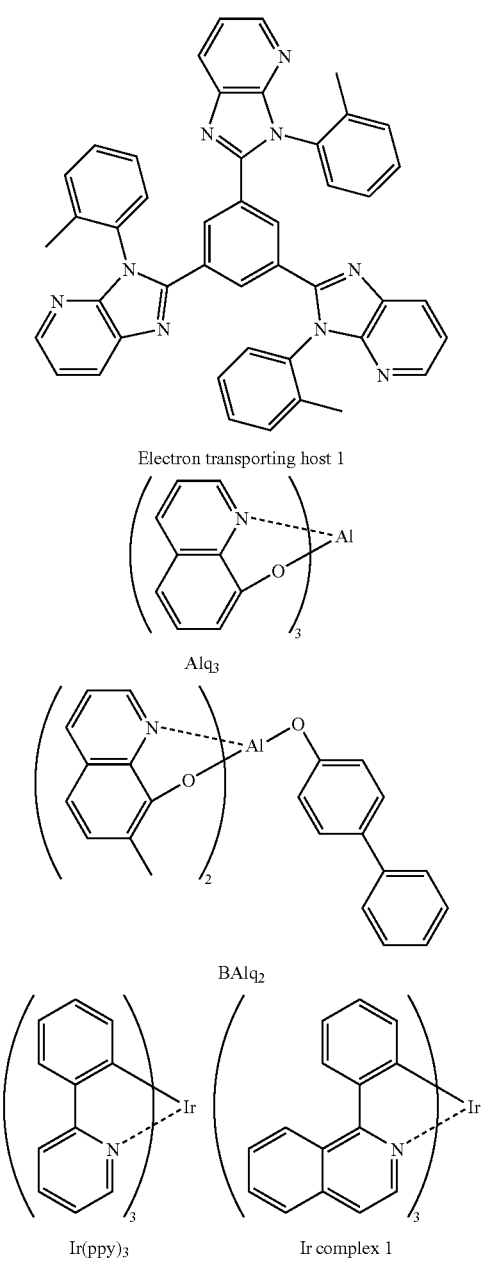

Electron transporting host 1

Alq₃

BAlq₂

Ir(ppy)₃          Ir complex 1

[Evaluation]

The ionization potential (Ip) and the electron affinity (Ea) of each of the hole transporting material in the hole transporting layer, the hole transporting material in the light-emitting layer, the electron transporting material in the light-emitting layer, and the electron transporting material in the electron transporting layer, as well as the ionization potential (Ip) and the electron affinity (Ea) of each of the electron transporting layer and the hole transporting layer were measured by the following method in terms of a single layer film (independent layer). The results obtained are shown in Table 1 below.

—Ionization Potential (Ip)—

The ionization potential (Ip) was measured by an ultraviolet photoelectron analyzer AC-1 (manufactured by Riken Keiki Co., Ltd.).

—Electron Affinity (Ea)—

The electron affinity (Ea) was obtained as follows: calculating the band gap from the absorption spectrum of the single layer film and then calculating the electron affinity (Ea) from the values of the calculated band gap and the above ionization potential (Ip).

Using the light-emitting element obtained above, the external quantum efficiency was measured by the following method.

—External Quantum Efficiency—

The waveform of the light emission spectrum of the produced light-emitting element was measured by using a Multi-Channel Analyzer PMA-11 manufactured by Hamamatsu Photonics K.K. Based on the measured data, the wavelength value at the light emission peak was determined. Thereafter, the external quantum efficiency was calculated from the measured waveform of the light emission spectrum and the current and brightness (200 cd/m²) at the measurement, and evaluated according to the following criteria. The results are shown in Table 1 below.

[Evaluation Criteria]

| A: | 12% or more |
| B: | 6% or more and less than 12% |
| C: | 3% or more and less than 6% |
| D: | less than 3% |

—Driving Durability Test—

A DC voltage was applied to the organic EL element to cause light emission by using a Source Measure Unit Model 2400 manufactured by KEITHLEY, the brightness of which was measured by using a Brightness Meter BM-8 manufactured by Topcon Corporation to calculate the external quantum efficiency at 2,000 cd/m².

Subsequently, this light-emitting element was subjected to a continuous driving test under the condition that the initial brightness was 2,000 cd/m², the time period until the brightness decreased to 1,000 cd/m² was determined as a brightness half-life time T(1/2), and this brightness half-life time was evaluated according to the following evaluation criteria.

[Evaluation Criteria]

| A: | 500 hr or more |
| B: | 250 hr or more and less than 500 hr |
| C: | 100 hr or more and less than 250 hr |
| D: | less than 100 hr |

Example 2

A light-emitting element was obtained in the same manner as in Example 1, except for changing Iridium Complex 1 as the luminescent dopant to Ir(ppy)₃, and subjected to the same evaluation tests. The results are shown in Table 1 below.

Example 3

A light-emitting element was obtained in the same manner as in Example 1, except for changing Iridium Complex 1 as the luminescent dopant to rubrene, and subjected to the same evaluation tests. The results are shown in Table 1 below.

Example 4

A light-emitting element was obtained in the same manner as in Example 2, except for changing BAlq$_2$ to electron transporting host 1, and subjected to the same evaluation tests. The results are shown in Table 1 below.

Example 5

A blue light-emitting element was obtained in the same manner as in Example 4, except for changing m-MTDATA as the material of the hole transporting layer to 4,4'-bis[N-(1-naphthyl)-N-phenylamino]biphenyl (NPD), changing m-MTDATA as the hole transporting material in the light-emitting layer to hole transporting host 2 as shown below, changing electron transporting host 1 as the electron transporting material in the light-emitting layer to electron transporting host 2 as shown below, and changing Ir(ppy)$_3$ as the luminescent material to Ir Complex 2 as shown below, and subjected to the same evaluation tests. The results are shown in Table 1 below.

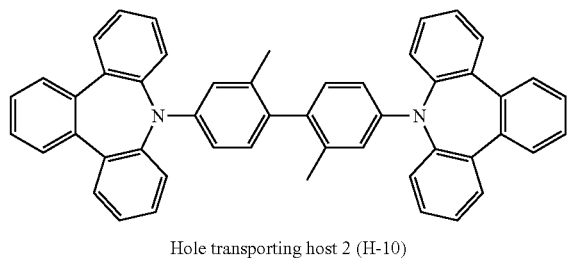

Hole transporting host 2 (H-10)

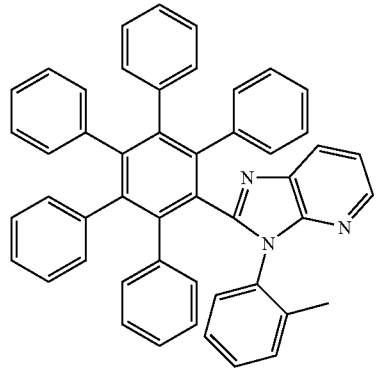

Electron transporting host 2 (E-12)

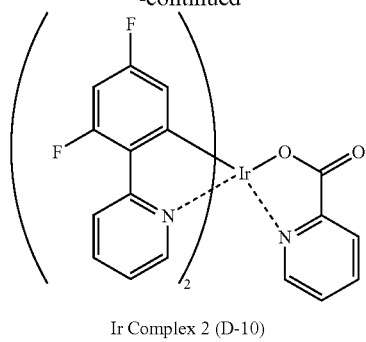

Ir Complex 2 (D-10)

Comparative Example 1

A light-emitting element was obtained in the same manner as in Example 1, except for not using electron transporting host 1 and changing Ir Complex 1 as the luminescent dopant to Ir(ppy)$_3$, and subjected to the same evaluation tests. The results are shown in Table 1 below.

Comparative Example 2

A light-emitting element was obtained in the same manner as in Example 2, except for using Alq$_3$ instead of electron transporting host 1 and using 4,4'-bis[N-(1-naphthyl)-N-phenylamino]biphenyl (NPD) instead of m-MTDATA in the light-emitting layer and the hole transporting layer, and subjected to the same evaluation tests. The results are shown in Table 1 below.

Comparative Example 3

A light-emitting element was obtained in the same manner as in Example 3, except for using Alq$_3$ instead of electron transporting host 1 and using 4,4'bis[N-(1-naphthyl)-N-phenylamino]biphenyl (NPD) instead of m-MTDATA in the light-emitting layer and the hole transporting layer, and subjected to the same evaluation tests. The results are shown in Table 1 below.

Figure 1G:
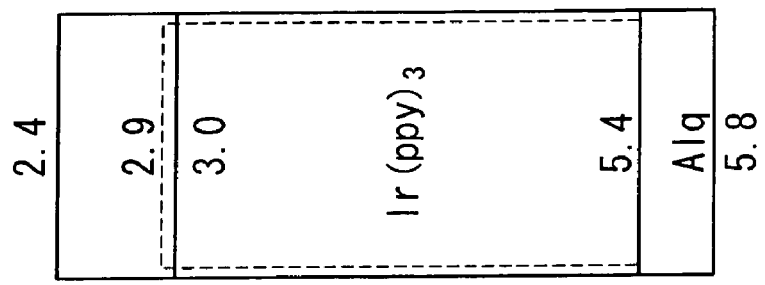
Figure 1F:
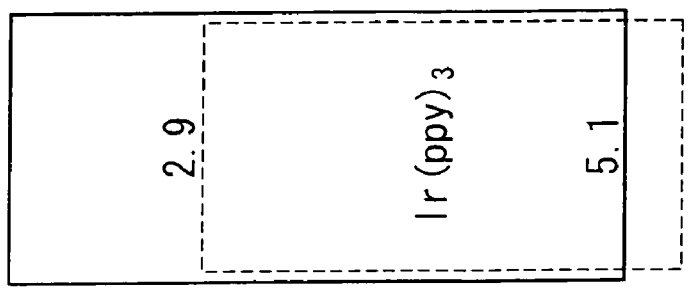

FIGS. 1A to 1H show the energy diagrams in these Examples and Comparative Examples.

TABLE 1

| | | Example 1 | Example 2 | Example 3 | Example 4 | Example 5 | Comparative Example 1 | Comparative Example 2 | Comparative Example 3 |
|---|---|---|---|---|---|---|---|---|---|
| Hole injecting/transporting layer | HTL | CuPc/m-MTDATA | CuPc/m-MTDATA | CuPc/m-MTDATA | CuPc/m-MTDATA | CuPc/NPD | CuPc/m-MTDATA | CuPc/NPD | CuPc/NPD |
| Light-emitting layer | HTH | m-MTDATA | m-MTDATA | m-MTDATA | m-MTDATA | Hole Transporting Host 2 | m-MTDATA | NPD | NPD |
| | ETH | Electron Transporting Host 1 | Electron Transporting Host 1 | Electron Transporting Host 1 | Electron Transporting Host 1 | Electron Transporting Host 2 | None | Alq$_3$ | Alq$_3$ |
| | Dopant | Ir Complex 1 (red) | Ir(ppy)$_3$ (green) | Rubrene (yellow) | Ir(ppy)$_3$ (green) | Ir Complex 2 | Ir(ppy)$_3$ (green) | Ir(ppy)$_3$ (green) | Rubrene |
| Electron transporting layer | ETL | BAlq$_2$/Alq$_3$ | BAlq$_2$/Alq$_3$ | BAlq$_2$/Alq$_3$ | Electron Transporting Host 1/Alq$_3$ | Electron Transporting Host 1/Alq$_3$ | BAlq$_2$/Alq$_3$ | BAlq$_2$/Alq$_3$ | BAlq$_2$/Alq$_3$ |
| Ip(D): Ip of dopant | | 5.5 | 5.4 | 5.4 | 5.4 | 5.8 | 5.4 | 5.4 | 5.4 |

TABLE 1-continued

| | Example 1 | Example 2 | Example 3 | Example 4 | Example 5 | Comparative Example 1 | Comparative Example 2 | Comparative Example 3 |
|---|---|---|---|---|---|---|---|---|
| Ip(H)min: Ip of host compound having minimum Ip | 5.1 | 5.1 | 5.1 | 5.1 | 5.4 | 5.1 | 5.4 | 5.4 |
| ΔIp: Ip(D)-Ip(H)min | 0.4 | 0.3 | 0.3 | 0.3 | 0.4 | 0.3 | 0 | 0 |
| Ea(H)max: Ea of host compound having maximum Ea | 3.6 | 3.6 | 3.6 | 3.6 | 3.2 | — | 3.0 | 3.0 |
| Ea(D) | 3.2 | 2.9 | 3.1 | 2.9 | 2.9 | 2.9 | 2.9 | 3.1 |
| ΔEa: Ea(H)max-Ea(D) | 0.4 | 0.7 | 0.5 | 0.3 | 0.3 | — | 0.1 | −0.1 |
| Ea(ETL): Ea of electron transporting layer (ETL) | 2.9 | 2.9 | 2.9 | 3.6 | 3.6 | 2.9 | 2.9 | 2.9 |
| Ip(HTL): Ip of hole transporting layer (HTL) | 5.1 | 5.1 | 5.1 | 5.4 | 5.4 | 5.1 | 5.4 | 5.4 |
| T1(D): triplet excitation energy T1 of dopant | 2.13 | 2.60 | 2.10 | 2.60 | 2.70 | 2.60 | 2.60 | 2.10 |
| T1(H)min: Ti of host compound having minimum triplet excitation energy | 2.74 | 2.74 | 2.74 | 2.74 | 2.83 | 2.74 | 2.21 | 2.21 |
| Durability | A | B | B | A | C | D | C | C |
| External quantum efficiency | B | A | C | A | B | B | B | C |

As seen in Table 1, from comparison between Example 2 using a double host (DH) and Comparative Example 1 using a single host (SH), DH is superior to SH in both luminescent property (external quantum efficiency) and driving durability.

When Example 2 and Comparative Example 2 both using a double host (DH) are compared, neither the driving durability or the external quantum efficiency are good in Comparative Example 2 where ΔIp is 0, whereas both of these properties are good in Example 2.

Also, it can be seen from comparison of elements having a singlet excitation state or elements having a triplet excitation state that the driving durability and the luminescent property (external quantum efficiency) are both good in Examples 2 and 3, satisfying the requirements of ΔIp>0 eV and ΔEa>0 eV, as compared with Comparative Examples 2 and 3 in which these requirements are not satisfied.

Further, the results of Example 4 show that when the electron affinity Ea(ETL) of the electron transporting layer is higher than the electron affinity Ea(D) of the dopant contained in the light emitting layer, good results in the driving durability and the luminescent property (external quantum efficiency) can be obtained. The results of Example 5 show that good results can also be obtained when a blue phosphorescent dopant is used.

According to the present invention, an organic electroluminescent element excellent in driving durability and luminescent property can be provided.

The light-emitting element of the present invention can be suitably used in the fields of display devices, displays, backlights, electrophotography, light sources for illumination, light sources for recording, light sources for exposure, light sources for reading, signs, sign boards, interiors, optical communications and the like.

Further, the compound for use in the present invention is a compound also applicable to medical usage, fluorescent brightening agents, photographic materials, UV-absorbing materials, laser dyes, materials for recording media, pigments for inkjet printing, dyes for color filters, color conversion filters and the like.

What is claimed is:

1. An organic electroluminescent element comprising:
a pair of electrodes and one or more organic compound layers including at least one light-emitting layer disposed between the pair of electrodes,
wherein the at least one light-emitting layer contains at least one luminescent dopant and a plurality of host compounds;
the ionization potential of the dopant is Ip(D), the minimum value out of the ionization potentials of the plurality of host compounds is Ip(H)min, and ΔIp is defined by ΔIp=Ip(D)−Ip(H)min and satisfies a relationship of ΔIp>0 eV;
the electron affinity of the dopant is Ea(D), the maximum value out of the electron affinities of the plurality of host compounds is Ea(H)max, and ΔEa is defined by ΔEa=Ea(H)max−Ea(D) and satisfies a relationship of ΔEa>0 eV; and
wherein when the minimum value out of the minimum triplet excitation energies of the plurality of host compounds is T1(H)min, the minimum value satisfies a relationship of T1(H)min>T1(D), where T1(D) is the minimum triplet excitation energy of the dopant.

2. The organic electroluminescent element of claim 1, wherein at least one of the relationships of 1.2 eV>ΔIp>0.2 eV and 1.2 eV>ΔEa>0.2 eV is satisfied.

3. The organic electroluminescent element of claim 2, wherein, when a single layer film of only the plurality of host compounds contained in the light-emitting layer is formed under the same conditions as in the formation of the light-emitting layer, the fluorescent phosphorescent spectrum of the film is assigned to the respective light emission spectra of the individual host compounds each as measured alone.

4. The organic electroluminescent element of claim 2, wherein the one or more organic compound layers comprise a carrier transporting layer adjacent to the at least one light-emitting layer.

5. The organic electroluminescent element of claim 4, wherein the carrier transporting layer is at least one of an electron transporting layer and a hole transporting layer.

6. The organic electroluminescent element of claim 4, wherein the carrier transporting layer is an electron transporting layer and the electron affinity Ea(ETL) of the electron transporting layer is larger than the electron affinity Ea(D) of the dopant contained in the at least one light-emitting layer.

7. The organic electroluminescent element of claim 4, wherein the carrier transporting layer is a hole transporting layer and the ionization potential Ip(HTL) of the hole transporting layer is smaller than the ionization potential Ip(D) of the dopant contained in the at least one light-emitting layer.

8. The organic electroluminescent element of claim 1, wherein, when a single layer film of only the plurality of host compounds contained in the light-emitting layer is formed under the same conditions as in the formation of the light-emitting layer, the fluorescent phosphorescent spectrum of the film is assigned to the respective light emission spectra of the individual host compounds each as measured alone.

9. The organic electroluminescent element of claim 1, wherein the one or more organic compound layers comprise a carrier transporting layer adjacent to the at least one light-emitting layer.

10. The organic electroluminescent element of claim 9, wherein the carrier transporting layer is at least one of an electron transporting layer and a hole transporting layer.

11. The organic electroluminescent element of claim 9, wherein the carrier transporting layer is an electron transporting layer and the electron affinity Ea(ETL) of the electron transporting layer is larger than the electron affinity Ea(D) of the dopant contained in the at least one light-emitting layer.

12. The organic electroluminescent element of claim 9, wherein the carrier transporting layer is a hole transporting layer and the ionization potential Ip(HTL) of the hole transporting layer is smaller than the ionization potential Ip(D) of the dopant contained in the at least one light-emitting layer.

13. The organic electroluminescent element of claim 1, wherein the content of each of the plurality of host compounds is from 15 to 85 mass % based on the mass of all compounds constituting the light-emitting layer.

14. The organic electroluminescent element of claim 1, wherein at least one of the conditions of Ip(H)min being 5.1 eV or more and Ea(H)max being 3.0 eV or less is satisfied.

15. An organic electroluminescent element comprising:
a pair of electrodes and one or more organic compound layers including at least one light-emitting layer disposed between the pair of electrodes,
wherein the at least one light-emitting layer contains at least one luminescent dopant and a plurality of host compounds;
the ionization potential of the dopant is Ip(D), the minimum value out of the ionization potentials of the plurality of host compounds is Ip(H)min, and ΔIp is defined by ΔIp=Ip(D)−Ip(H)min and satisfies a relationship of ΔIp>0 eV;
the electron affinity of the dopant is Ea(D), the maximum value out of the electron affinities of the plurality of host compounds is Ea(H)max, and ΔEa is defined by ΔEa=Ea(H)max−Ea(D) and satisfies a relationship of ΔEa>0 eV, and wherein the plurality of host compounds include a hole transporting host and an electron transporting host; and
wherein when the minimum value out of the minimum triplet excitation energies of the plurality of host compounds is T1(H)min, the minimum value satisfies a relationship of T1(H)min>T1(D), where T1(D) is the minimum triplet excitation energy of the dopant.

16. The organic electroluminescent element of claim 15, wherein the dopant is an iridium complex, a platinum complex or a rhenium complex containing at least one coordination bond of a metal-carbon bond, metal-nitrogen bond, metal-oxygen bond or metal-sulfur bond.

17. The organic electroluminescent element of claim 15, wherein the hole transporting host is a compound having a plurality of carbazole skeletons and/or aromatic tertiary amine skeletons within the molecule.

18. The organic electroluminescent element of claim 15, wherein the electron transporting host is a metal complex, an azole derivative or an azine derivative, the azole derivative being a benzimidazole derivative or an imidazopyridine derivative, and the azine derivative being a pyridine derivative, a pyrimidine derivative or a triadine derivative.

19. An organic electroluminescent element comprising:
a pair of electrodes and one or more organic compound layers including at least one light-emitting layer disposed between the pair of electrodes,
wherein the at least one light-emitting layer contains at least one luminescent dopant and a plurality of host compounds;
the ionization potential of the dopant is Ip(D), the minimum value out of the ionization potentials of the plurality of host compounds is Ip(H)min, and ΔIp is defined by ΔIp=Ip(D)−Ip(H)min and satisfies a relationship of ΔIp>0 eV;
the electron affinity of the dopant is Ea(D), the maximum value out of the electron affinities of the plurality of host compounds is Ea(H)max, and ΔEa is defined by ΔEa=Ea(H)max−Ea(D) and satisfies a relationship of ΔEa>0 eV,
wherein the plurality of host compounds include a hole transporting host and an electron transporting host;
the hole transporting host is selected from H-1, H-3, H-4, H-7 or H-8 represented by the following formulae;

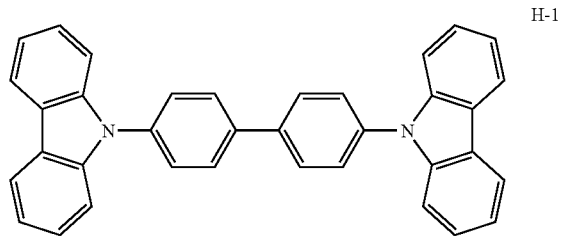

H-1

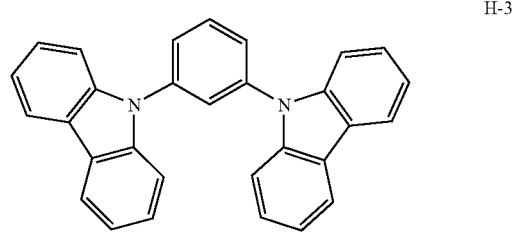

H-3

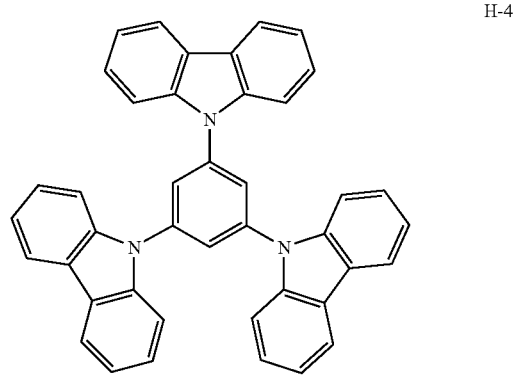

H-4

-continued

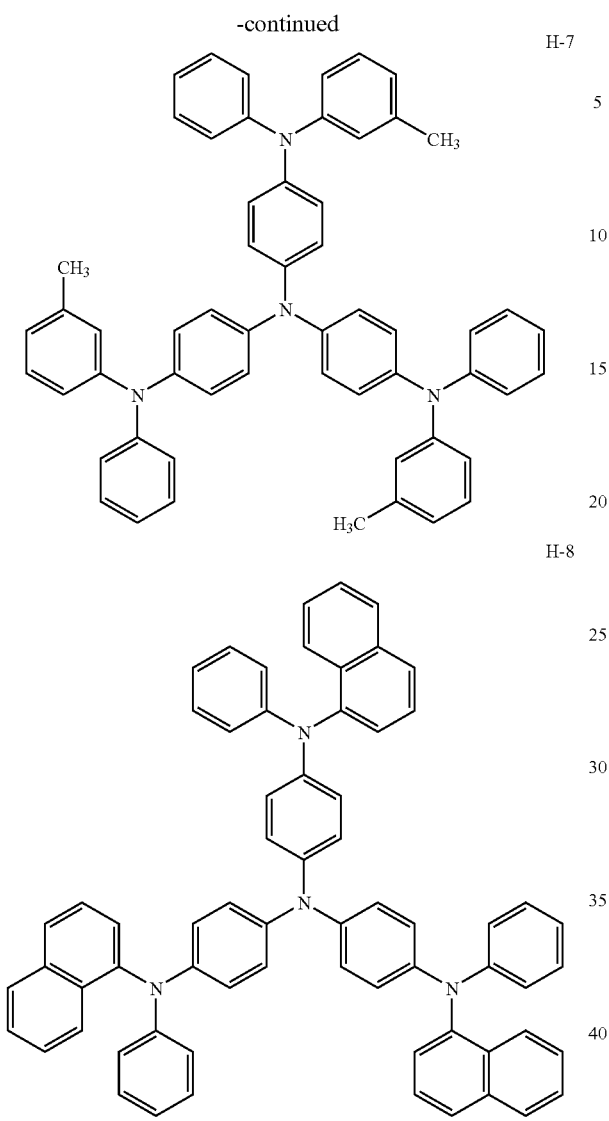

the electron transporting host is selected from E-1 or E-11 represented by the following formulae;

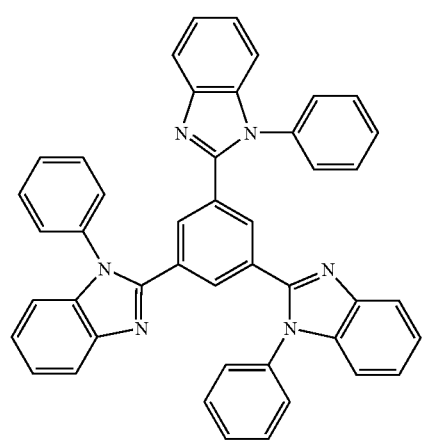

-continued

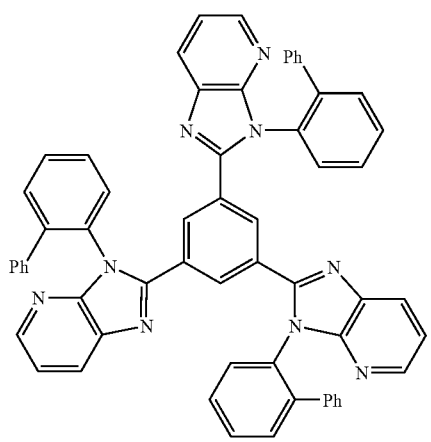

and the luminescent dopant is selected from D-1 or D-3 represented by the following formulae

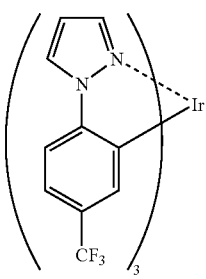

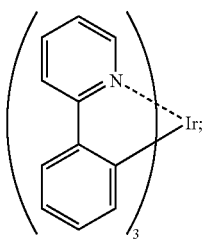

and wherein when the minimum value out of the minimum triplet excitation energies of the plurality of host compounds is T1(H)min, the minimum value satisfies a relationship of T1(H)min>T1(D), where T1(D) is the minimum triplet excitation energy of the dopant.

* * * * *